United States Patent
Ahn et al.

(10) Patent No.: US 11,037,478 B2
(45) Date of Patent: Jun. 15, 2021

(54) STRETCHABLE DISPLAY PANEL AND STRETCHABLE DISPLAY DEVICE INCLUDING THE SAME

(71) Applicant: LG Display Co., Ltd., Seoul (KR)

(72) Inventors: JiYoung Ahn, Goyang-si (KR); Seulki Kim, Seosan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/712,256

(22) Filed: Dec. 12, 2019

(65) Prior Publication Data

US 2020/0211437 A1    Jul. 2, 2020

(30) Foreign Application Priority Data

Dec. 28, 2018  (KR) ........................ 10-2018-0171997

(51) Int. Cl.
  *G09G 3/20*       (2006.01)
  *H01L 27/32*      (2006.01)
  *H01L 51/00*      (2006.01)

(52) U.S. Cl.
  CPC ........... *G09G 3/20* (2013.01); *H01L 27/3225* (2013.01); *H01L 27/3276* (2013.01); *H01L 51/0097* (2013.01); *G09G 2300/043* (2013.01); *G09G 2310/08* (2013.01); *G09G 2320/02* (2013.01); *G09G 2380/02* (2013.01); *H01L 2251/5338* (2013.01)

(58) Field of Classification Search
  CPC ..... G09G 2300/0426; G09G 2300/043; G09G 2310/08; G09G 2320/02; G09G 2380/02; G09G 3/20; G09G 3/3225; H01L 2251/5338; H01L 27/3225; H01L 27/3276; H01L 51/0097
  See application file for complete search history.

(56) References Cited

U.S. PATENT DOCUMENTS

2017/0179160 A1*  6/2017  Takahashi ............ G09G 3/2092
2017/0277341 A1*  9/2017  Lim .................... G06F 3/04166

FOREIGN PATENT DOCUMENTS

KR    10-2017-0110772 A    10/2017

* cited by examiner

*Primary Examiner* — Chun-Nan Lin
(74) *Attorney, Agent, or Firm* — Seed IP Law Group LLP

(57) ABSTRACT

A stretchable display device having a pliant substrate and a plurality of rigid substrates positioned on the first substrate spaced a first selected distance apart from each other. The pliant substrate having a having a first modulus of elasticity and the second substrates having a second modulus of elasticity that is greater than first modulus of elasticity. There is a semiconductor circuit have a semiconductor transistor and positioned on each of the rigid substrates. At least some of the rigid substrates also include an organic light emitting diode formed thereon. The pliant substrate is configured to stretch, moving the rigid substrates a second distance apart from each other that is greater than the first selected distance. Electrically conductive lines extend between respective ones of the second substrates, each of the electrically conductive lines being configured to stretch to maintain the rigid substrates electrically connected to each other when spaced the first distance apart from each other and also when they are spaced the second, greater distance from each other.

13 Claims, 15 Drawing Sheets

STRETCHABLE DISPLAY PANEL AND STRETCHABLE DISPLAY DEVICE INCLUDING THE SAME

CROSS-REFERENCE TO RELATED APPLICATION

This application claims the priority of Korean Patent Application No. KR 10-2018-0171997 filed on Dec. 28, 2018, in the Korean Intellectual Property Office, the disclosure of which is incorporated herein by reference.

BACKGROUND

Technical Field

The present disclosure relates to a display device and, more particularly, to a stretchable display device having a display panel therein that can stretch.

Description of the Related Art

An Organic Light Emitting Display (OLED) that generates light by itself, a Liquid Crystal Display (LCD) that uses separate light sources, and other types of displays are used as the display devices used in a computer monitor, a TV, and a mobile phone.

Display devices are being used in more various fields including not only a computer monitor, a TV, personal mobile devices, and also in display devices having a large display area with reduced volume and weight.

Recently, a stretchable display device manufactured to be able to stretch/contract in a specific direction and change into various shapes by forming a display unit on a flexible substrate that is a plastic material has been spotlighted as a next generation display device.

BRIEF SUMMARY

Accordingly, the present disclosure is directed to a display panel and a stretchable display device that overcomes and compensates for one or more problems due to limitations and disadvantages of the related art.

One of the objects of the present disclosure is to provide a stretchable display device that can stretch. Another object is to provide a high quality image from the display device while it is being stretched and also after is has been stretched and returned to its former shape.

Another object of the present disclosure is to provide a stretchable display device in which a plurality of rigid substrates are disposed on a base substrate made of a pliable material and light emitting elements are formed on some of the rigid substrates, thereby being able to form the light emitting elements without damaging the circuits and light elements on the substrates while providing a display that is stretchable. In some embodiments, various drive and control circuits that are constructed on rigid substrates are also placed on the same pliable base substrate with the light emitting elements, providing a display panel in which the entire panel is stretchable that includes the light emitting elements, drive elements, control circuits are all other circuits that make up the display.

Another object of the present disclosure is to provide a stretchable display device that can sense the degree of stretch of the display panel. One way to sense the degree of stretch makes use of flexible connecting lines electrically connecting a plurality of rigid substrates. Another way disposes stretch sensing lines that can sense the degree of stretch of the display panel.

Another object of the present disclosure is to provide a stretchable display device that can reduce the deterioration of image quality of the stretchable display device. One of the ways to maintain the image quality at a high level is to sense the degree of stretch of a display panel and then generate compensation data in accordance with the degree of stretch sensed that is applied to the data to each pixel.

Objects of the present disclosure are not limited to the above-mentioned objects, and other objects, which are not mentioned above, can be clearly understood by those skilled in the art from the following descriptions.

It is to be understood that both the foregoing general description and the following detailed description of the present disclosure are exemplary and explanatory and are intended to provide further explanation of the disclosure as claimed.

The present disclosure describes a display device that may be easily bent, flexed or stretched without damaging driving elements and light emitting elements disposed in a stretchable display device by disposing a plurality of rigid substrates on a base substrate composed of a stretchable, pliant or flexible material. The driving and control circuits as well as the light emitting elements are disposed on respective, individual rigid substrates.

The present disclosure may sense the degree of stretch of a substrate using a connecting line by configuring at least one or more connecting lines of a plurality of connecting lines electrically connecting a plurality of rigid substrates spaced apart from each other on a base substrate made of a stretchable material to include two sensing lines.

The present disclosure may use a panel area by configuring at least one or more connecting lines of a plurality of connecting lines as a stretch sensing line and by configuring one of the sensing lines to be the same line that transmits a data signal, gate signal, OLED characteristic correction signal, or other control signal to each subpixel and to sense the degree of stretch of a panel.

The present disclosure may sense the degree of stretch of a display panel by additionally disposing a stretch sensing line that may sense the degree of stretch of the display panel over the display panel that is a different line than a connecting line transmitting a data or gate signal to respective ones of the plurality of pixels.

The present disclosure enables a display panel to stretch and also reduce deterioration of image quality caused by the stretch. One of the ways it does this is to create compensation data by comparing a sensed value of the degree of stretch and a reference value, and then apply compensation data to each respective pixel. In one embodiment, the stretch at each local pixel is sensed and compensation provided that is different on a pixel by pixel basis. In other embodiments, the degree of stretch of a group of pixels is sensed and compensation provide for a group of pixels. In some embodiments, the stretch of the drive and control circuits can be sensed and compensation provided based on the degree of stretch such circuits experience.

According to one embodiment a stretchable display device is provided having a first pliant substrate having a first modulus of elasticity. There are a plurality of second substrates positioned on the first substrate and spaced apart from each other, each of the second substrates being rigid and having a second modulus of elasticity that is greater than first modulus of elasticity. At least one semiconductor transistor is positioned on each of the second substrates of the plurality. There are electrically conductive lines extending between respective ones of the second substrates, each of the electrically conductive lines configured to be stretched while remaining electrically conductive.

In one embodiment, each of the second substrates has a light emitting element positioned thereon. The electrically conductive lines extending between respective ones of the second substrates is a data line that provides a data signal to the light emitting element on the second substrate. The second modulus of elasticity is more than one thousand times greater than the first modulus of elasticity.

The electrically conductive lines have a flexible, twisty, wavy shape in one embodiment. The electrically conductive lines have a stretchable diamond shape in another embodiment.

In one embodiment there is a stretch sensor positioned between the second substrates. The stretch sensor includes a first capacitor whose value remains constant while the stretch sensor is being stretched and a second capacitor whose value varies in relationship to an amount of the stretch while the stretch sensor is being stretched. The stretch sensor is positioned within one of the electrically conductive lines that extends between respective ones of the second substrates. At least one of the electrically conductive lines extending between respective ones of the second substrates is a gate line for the transistor on the second substrate.

In accordance with another embodiment there is a method of using the stretchable display by stretching the first substrate having a first modulus of elasticity a first distance. There are a plurality of second, rigid substrates positioned on the first substrate a first distance away from each other. Each of the second substrates has a second modulus of elasticity that is greater that the first modulus of elasticity. Each of the second substrates of the plurality has at least one semiconductor transistor thereon. During a stretching step, the the respective second substrate move a second distant from each other that is greater than the first distance during the stretching. The electrical connection between the second substrates is maintained by a stretchable conductive line between the plurality of second substrates prior to and after the stretching. In one embodiment, the amount of stretch of the first substrate is measured during the stretching. A stretch compensation signal is generated based on the measured amount of stretch during the stretching. A light emission data signal is transmitted to the organic light emitting diodes during the stretching. The light emission data signal that is transmitted to the organic light emitting diode is modified during the stretching step based on the generated compensation signal. A gate drive signal is transmitted to the at least one transistor on the rigid substrate during the stretching. After a period of time, the stretching terminates the first substrate returns to the unstretched shape after the stretching.

According to one embodiment, there is a method of making a stretchable display panel that includes providing a first pliant substrate having a first modulus of elasticity. A plurality of second, rigid substrates, are formed having respective semiconductor transistor circuits on each of the second, rigid substrates. The second substrates have a second modulus of elasticity that is greater than the modulus of elasticity of the first pliant substrate. The plurality of second, rigid substrates on the first substrate are spaced a selected distance apart from each other. Electrically conductive lines are formed connecting the plurality of second, rigid substrates to each other with respective electrically conductive lines. Each of the electrically conductive lines are pliant and has third modulus of elasticity that is less than the second modulus of elasticity.

An organic light emitting diode is disposed on at least some of the respective ones of the plurality of second, rigid substrates. A stretch sensor is formed in at least one of the plurality of electrically conductive lines connecting the respective ones of the plurality of second, rigid substrates to each other.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
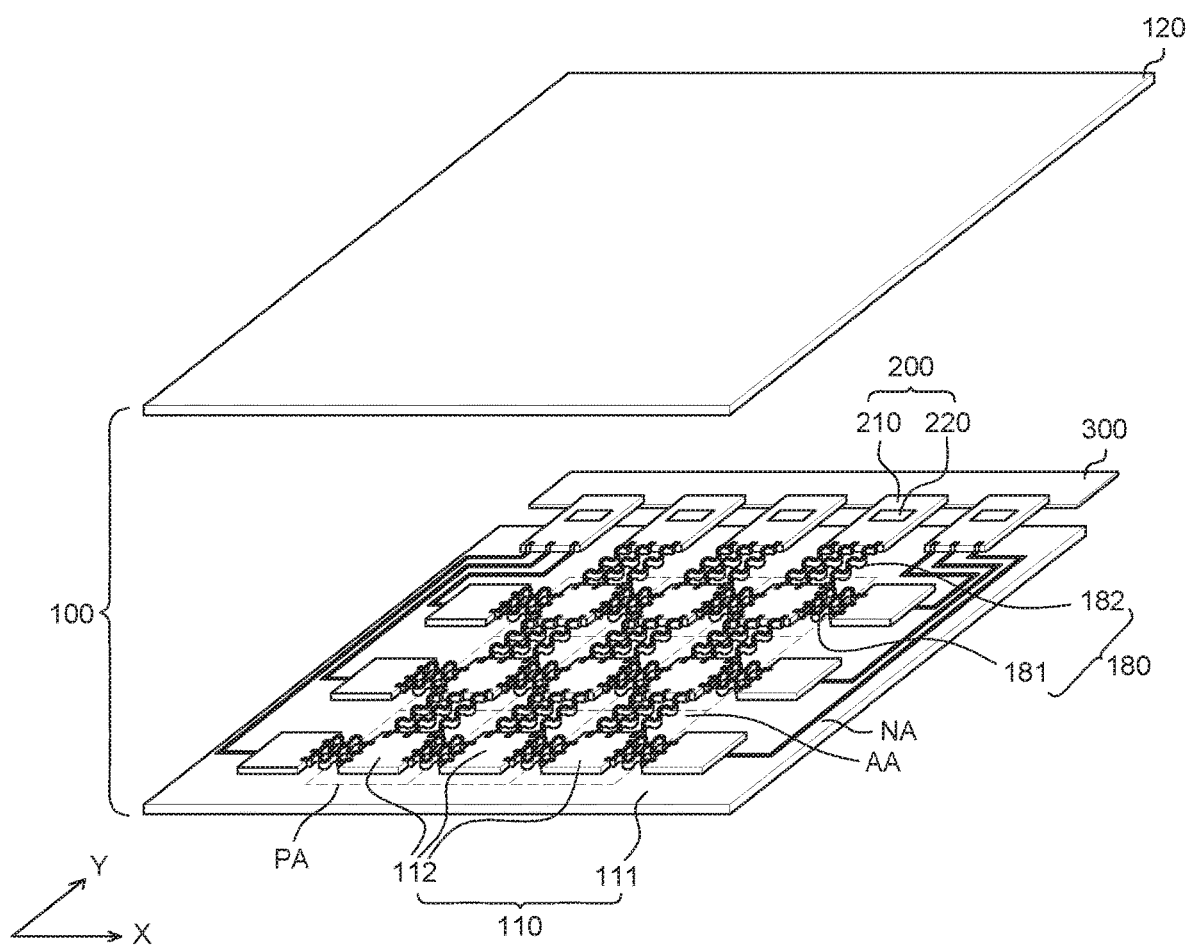
FIG. 1 is an exploded perspective view of a stretchable display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description and ease of understanding, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

A stretchable display device may be referred to as a display device that may display images even if it is bent, flexed or stretched. A stretchable display device may have high flexibility, as compared with common display devices. Accordingly, the shape of the stretchable display device may be freely changed in accordance with operation by the user such as bending or stretching the stretchable display device. For example, when a user holds and pulls an end of a stretchable display device, the stretchable display device may be stretched by the force of the user. Alternatively, when a user puts a stretchable display device on an uneven wall, the stretchable display device may be disposed to be bent in the surface shape of the wall. Further, when the force applied by a user is removed, a stretchable display device may return into the initial shape.

FIG. 1 is an exploded perspective view of a stretchable display device according to an embodiment of the present disclosure. Referring to FIG. 1, a stretchable display device 1000 according to an embodiment of the present disclosure includes a display panel 100, a flexible connecting film 200, and a printed circuit board 300.

The display panel 100 can stretch and contract in any one direction of a first direction X and a second direction Y or can 2-dimensionally stretch and contract in the first direction X and the second direction Y. Here, the first direction X and the second direction Y define the plane of the stretchable display device 1000 and the second direction Y may be a direction different from the first direction X. For example, the second direction Y may be a direction substantially perpendicular to the first direction X.

The display panel 100 includes a lower substrate 110 disposed at a lower portion and an upper substrate 120 disposed on the lower substrate 110. Though not shown in FIG. 1, the display panel 100 may further include a polarizing layer that may be disposed on the upper substrate 120 or under the lower substrate 110. Further, the lower substrate 110 and the upper substrate 120 of the display panel 100, may be bonded by an adhesive layer.

The lower substrate 110 is a substrate for supporting and protecting various components of the stretchable display device 1000. The lower substrate 110 may include a first substrate 111 of the lower substrate 110 made of a pliable material and being able to stretch and contract and a plurality of second substrates 112 disposed on the first substrate 111 of the lower substrate 110 and made of a rigid material more than the first substrate 111. Here, the first substrate 111 may be referred to as a base substrate or a flexible substrate and the plurality of second substrates 112 may be referred to as rigid substrates.

The first substrate 111 may be made of an insulating material that may bend or stretch. For example, the first substrate 111 may be made of silicon rubber such as polydimethylsiloxane (PDMS) or an elastomer such as polyurethane (PU), so it may have flexibility. The material of the first substrate 111, however, is not limited thereto. The first substrate 111, which is a flexible substrate, may reversibly expand and contract. Further, an elastic modulus may be several to hundreds of GPa for the Young's Modulus and a tensile fracture rate may be 100% or more. In some embodiments the Young's Modulus or the first substrate is less than 100 GPa, while it is in the range of 100 to 1000 GPa in other embodiments. In some embodiments, it might be in the range of greater than 1000 and less than 10,000 GPa. The thickness of the first substrate 111 may be 10 µm to 1 mm, but is not limited thereto.

The plurality of second substrates 112 spaced and disposed by a predetermined distance from each other are disposed on the first substrate 111. The plurality of second substrates 112 are substrates that are rigid more than the first substrate 111 made of a pliable material, but also may be flexible substrates with less elasticity. The plurality of second substrates 112, for example, may be made of polyimide (PI), polyacrylate, polyacetate, and the like.

The modulus of elasticity of the plurality of second substrates 112 may be higher than that of the first substrate 111. The modulus is an elastic modulus showing the ratio of deformation of a substrate to stress applied to the substrate, and when the modulus of elasticity is relatively high, the material is rigid and it resistance to flexing may be relatively high. Accordingly, the plurality of second substrates 112 may be rigid substrates that are more rigid than the first substrate 111. The modulus of elasticity measured as the Young's Modulus of the plurality of second substrates 112 may be a thousand times or more higher than that of the first substrate 111, but is not limited thereto. For example, the second substrates may be comprised of silicon, sapphire, glass or other rigid material and have a Young's Modulus in the range of 100,000 to 1,000,000 GPa. In other instances, the Young's Modulus of the second substrate will be in the range of 10,000,000 to 100,000,000 GPa. In other embodiments it will be in the range of 100,000,000 to 500,000,000 GPa or higher.

A light emitting element and various driving elements for driving the light emitting element, for example, a switching thin film transistor, a driving thin film transistor, a capacitor, etc. are disposed on each of the plurality of second substrates 112. Here, the light emitting element may be any one of an organic light emitting element and a micro LED.

In general, a stretchable display device has an easily bending or stretching characteristic, so there have been attempts in the past to use substrates that have a flexible property due to a small modulus. However, when a pliable material such as polydimethylsiloxane (PDMS) having a small modulus is used as the material of a lower substrate on which light emitting elements are disposed, a material having a small modulus is can become weak due to heat, so, due to this characteristic, there is a problem that the substrate is damaged by high temperature, for example, temperature over 100° C. that is generated in the process of forming transistors and the light emitting elements.

Accordingly, light emitting elements should be formed on a substrate made of a material that can withstand high temperature, so damage to the substrate can be avoided in the process of manufacturing light emitting elements. Accordingly, there have been attempts to manufacture a substrate using materials that can withstand high temperature, which is generated in the manufacturing process, such as polyimide (PI). However, materials that can withstand high temperature do not have flexible properties due to large moduli, so substrates are not easily bent or stretched when stretchable display devices are stretched. In addition, various types of light emitting elements, transistors and driving circuits are often constructed on semiconductor substrates which are frequently made of silicon that is rigid. If the individual components of the transistor, such as the gate, gate dielectric, source, drain and other electrodes flex, this will drastically change the operating characteristics of the transistor and, if flexed too much, will destroy the transistor. It is preferred that some circuit elements of the display device not bend or flex.

Therefore, the plurality of second substrates 112 that are rigid substrates are disposed in the areas where transistors or light emitting elements are disposed in the stretchable display device 1000 according to an embodiment of the present disclosure, so damage to the stretchable display device 1000 due to high temperature in the process of manufacturing the transistors or light emitting elements may be minimized.

Referring to FIG. 1, the plurality of second substrates 112 each may be electrically connected by connecting lines 180. The connecting lines 180 may be electrically connected by connecting pads disposed on each of the plurality of second substrates 112. Here, the pads disposed on each of the plurality of second substrates 112 may be, for example, gate pads, data pads, and power pads. Since the connecting lines 180 are disposed on the first substrate 111, they may have a twister or wavy shape to permit them to stretch without breaking. Although the connecting lines 180 are shown as having a twisty, wavy shape in an embodiment of the present disclosure, they are not limited thereto. The connecting lines 180 may have a straight shape, a chevron shape, or a simple way shape depending on the material of the connecting lines 180. For example, the lines 180 may have a diamond shape that will reduce damage to the connecting lines 180 due to stretching.

In common display devices, various lines such as a plurality of gate lines and a plurality of data lines are extended and disposed between a plurality of subpixels, and a plurality of subpixels are connected to one signal line. Accordingly, in common display devices, various lines such a gate line, a data line, a high-potential power line, and a reference voltage line extend from a side to the other side of the display devices on a substrate without disconnection.

By contrast, in the stretchable display device 1000 according to an embodiment of the present disclosure, various lines such as gate lines, data lines, high-potential power lines, and low-potential power lines, which are made of a metal material, are disposed on the plurality of second substrates 112. That is, in the stretchable display device 1000 according to an embodiment of the present disclosure, various lines made of a metal material may be disposed on the plurality of second substrates 112 and may not be formed to be in contact with the first substrate 111. Accordingly, various lines disposed in the stretchable display device 1000 may be patterned to correspond to the plurality of second substrates 112 and discontinuously disposed.

In the stretchable display device 1000 according to an embodiment of the present disclosure, the pads on two adjacent second substrates 112 may be connected by the connecting lines 180 to connect the discontinuous lines. That is, the connecting lines 180 electrically connect the pads on two adjacent second substrates 112. Accordingly, the stretchable display device 1000 according to an embodiment of the present disclosure includes a plurality of connecting lines 180 electrically connecting various lines such as gate lines, data lines, high-potential power lines, and reference voltage lines between the plurality of second substrates 112.

The connecting lines 180 electrically connect the plurality of second substrates 112. That is, the connecting lines 180 are disposed in spacing areas of the plurality of second substrates 112. The connecting lines 180 may be disposed between the pads disposed on the plurality of second substrates 112 and may electrically connect each pad. For example, though not shown, a gate line made of a metal material may be disposed on the plurality of second substrates 112 disposed adjacent to each other in the first direction X and gate pads may be disposed at both ends of the gate line. The plurality of gate pads on the plurality of second substrates 112 disposed adjacent to each other in the first direction X each may be connected to each other by a connecting line 180 functioning as a gate line. Accordingly, the gate lines disposed on the plurality of second substrates 112 and the connecting line 180 disposed on the first substrate 111 may function as one gate line. Further, all various lines that may be included in the stretchable display device 1000, such as the data lines, high-potential power lines, and low-potential power lines, also each may function as one line by a connecting line 180, as described above.

Referring to FIG. 1, the connecting lines 180 may include first connecting lines 181 and second connecting lines 182. The connecting lines 180 are pliant and have modulus of elasticity that is substantially less than the modulus of elasticity of the second substrates 112. In one embodiment, it is greater than the modulus of elasticity of the first substrate 111. It might be, in some examples, the modulus of elasticity of the connecting lines 180 might be 5 to 10 times greater than that of the first substrate 111, while in other embodiments, it might be 10 to 100 times greater.

The first connecting lines 181 refer to those lines disposed in the first direction X on the lower substrate 110. The first connecting lines 181 may connect pads on two substrates 112 disposed in parallel of the pads on the plurality of second substrates 112 disposed adjacent to each other in the first direction X to each other.

The first connecting lines 181 may include a gate connecting line transmitting a gate signal, a high-potential connecting line transmitting high-potential power, and a low-potential connecting line transmitting low-potential power. In addition, the first connecting lines 181 may further include a stretch sensing line configured to sense the degree of stretch of the lower substrate 110. The first connecting lines 181, particularly, the stretch sensing line will be described in more detail with reference to FIGS. 6 and 7 in association with a stretch sensing function that senses the degree of stretch of the lower substrate 110. Meanwhile, although the first connecting lines 181 are described as being composed of a gate connecting line, a high-potential connecting line, and a low-potential connecting line in this embodiment, they are not limited thereto.

The second connecting lines 182 refer to those lines disposed in the second direction Y on the lower substrate 110. The second connecting line 182 may connect pads on two substrates 112 disposed in parallel of the pads on the plurality of second substrates 112 disposed adjacent to each other in the second direction Y to each other.

The second connecting lines 182 may be data connecting lines transmitting a data signal to each subpixel. In some embodiments, at least one data connecting line of the data connecting lines that transmit a data signal to each subpixel, that is, the second connecting lines 182 may be configured to be able to sense the degree of stretch of the lower substrate 110 and transmit a data signal. Meanwhile, although the second connecting lines 182 are described as data connecting lines in an embodiment of the present disclosure, they are not limited thereto. The second connecting lines 182 will be described next in more detail with reference to FIGS. 2 to 5.

Meanwhile, as another embodiment, though not shown in FIG. 1, the second connecting lines 182 may further include a stretch sensing line configured to sense the degree of stretch of the lower substrate 110. In this case, the second connecting lines 182 may have only a function of sensing the degree of stretch of the lower substrate 110 without a function of transmitting a data signal. The second connecting lines 182, particularly, the stretch sensing line will be described in more detail with reference to FIGS. 8 and 9 in association with a stretch sensing function that senses the degree of stretch of the lower substrate 110.

Referring to FIG. 1, the connecting lines 180 electrically connect the pads disposed on adjacent second substrates 112 of the plurality of second substrates 112 and extend in a curved shape between the pads. That is, the first connecting lines 181 and the second connecting lines 182 each may extend in a wavy shape. For example, as shown in FIG. 1, the first connecting lines 181 and the second connecting lines 182 may have a sine waveform. However, the shapes of the first connecting lines 181 and the second connecting lines 182 are not limited thereto. For example, the first connecting lines 181 and the second connecting lines 182 may have various shapes, for example, they may extend in a zigzag shape or a plurality of diamond-shaped connecting lines extend with the apexes connected.

The first connecting lines 181 and the second connecting lines 182, for example, may be made of a metal material such as copper (Cu), silver (Ag), gold (Au). Accordingly, since the connecting lines 180 have a curved shape, even though the connecting lines 180 are made of a metal material, the stretchable display device 1000 of the present disclosure may minimize damage to the connecting lines 180 when the display panel 100 is stretched.

The lower substrate 110 may include a plurality of pixel areas PA defining unit cells, an active area AA including the plurality of pixel areas PA, and a non-active area NA surrounding the active area AA.

The plurality of pixel areas PA each may be an area defining a unit cell of the stretchable display device 1000. Each pixel area PA may be defined in an area where one second substrate 112 is disposed on the first substrate 111. That is, the pixel area PA may be defined as an area including one second substrate 112 and the first substrate 111 surrounding the second substrate 112. Alternatively, the pixel area PA may be defined as an area defined by a middle line in the first direction X and a middle line in the second direction Y in the spacing area between adjacent second substrates 112 in accordance with the shape of the second substrates 112. A light emitting element and various driving elements for driving the light emitting element, for example, a switching thin film transistor, a driving thin film transistor, a capacitor, etc. are disposed on the second substrates 112 in the pixel area PA.

The active area AA is an area where images are displayed in the stretchable display device 1000. The active area AA includes the plurality of pixel areas PA and the spaces between the pixels. That is, the plurality of pixel areas PA may be disposed in a checkerboard shape in the active area AA. The plurality of second substrates 112 are disposed in the active area AA on the first substrate 111 and are spaced apart from each other with gaps of a first selected distance between them.

The non-active area NA is an area adjacent to the active area AA. There are no light emitting elements in the NA. The non-active area NA may be disposed to surround the active area AA, adjacent to the active area AA. The non-active area NA is an area where an image is not displayed, and lines and circuits may be disposed in the non-active area NA. For example, a driving circuit such as a gate driving unit and a data driving unit, and a plurality of signal pads and power pads may be disposed in the non-active area AA. The driving circuit and each of the pads may be connected to each of the plurality of pixels disposed in the active area AA. The plurality of second substrates 112 made a material that is more rigid than the first substrate 111 may be spaced and disposed with predetermined gaps in the non-active area NA, equally to the active area AA, on the first substrate 111 made of a bendable or stretchable material.

When the first substrate 111 is stretched, the second substrates move a second distance apart from each other that is greater than the first selected distance. The connecting lines 180 provide electrical connection between the second substrates when they are the first distance apart from each other. When the first substrate 111 is stretched and the second substrates move a greater distance apart from each other, the connecting lines also stretch maintaining the electrical connections between the respective second substrates 112 to each other.

Although the plurality of second substrates 112 is described as being spaced apart from each other and disposed in the non-active area NA, equally to the active area AA, and being on the first substrate 111 with reference to FIG. 1 in one embodiment, the present disclosure is not limited thereto. The NA might have one or two larger substrates that are positioned directly adjacent to each other and the display be designed in such a way that the NA is not flexible to stretchable. Substrates made of the same material as the second substrates may be disposed in the non-active area NA throughout the entire surface of the first substrate 111. As described above, the reason of disposing the plurality of second substrates 112 or disposing substrates made of the same material as the second substrates on the first substrate 111 is for reducing damage to the driving unit or the pads disposed in the non-active area NA. Accordingly, in the structure in which the plurality of second substrates 112 are spaced and disposed in the non-active area NA, driving elements that may drive a plurality of subpixels, for example, transistors or IC chips constituting a gate driving unit or a data driving unit may be disposed on each of the plurality of second substrates 112. The connecting lines 180 in the active area AA may electrically connect the second substrates 112 in the non-active area NA and the second substrates 112 in the active area AA to each other by extending.

The flexible connecting film 200, which is films disposed with various components on a base film 210 made of a flexible material, is a component for supplying signals to the plurality of pixels disposed in the active area A/A of the lower substrate 110. The flexible connecting film 200 is disposed between the display panel 100 and the printed circuit board 300 and transmits signals input from the printed circuit board 300 to the pixels disposed in the active area AA of the lower substrate 110. That is, the flexible connecting film 200 may be disposed between the lower substrate 110 of the display panel 100 and the printed circuit board 300 and may electrically connect the lower substrate 110 and the printed circuit board 300.

The flexible connecting film 200 may be bonded by a plurality of bonding pads disposed in the non-active area NA. As shown in FIG. 1, a plurality of flexible connecting films 200 may be disposed in the non-active area NA. At least one of the plurality of flexible connecting films 200 may perform a function that supplies a power voltage, a data voltage, etc. to each of the plurality of pixels disposed in the active area AA through the bonding pads. Further, at least another one of the plurality of flexible connecting films 200 may also perform a function that calculates the degree of stretch by receiving a stretch sensing signal from connecting lines 180, which perform a function that senses the degree of stretch, of the plurality of connecting lines 180 disposed on the display panel 100 through the bonding pads.

The flexible connecting films 200 include a base film 210 and a driving IC 220 and various other components may be disposed on the flexible connecting films 200.

The base film 210 is a layer supporting the driving IC 220. The base film 210 may be made of an insulating material, and more detail, the base film 210 may be made of an insulating material having flexibility such as polyimide (PI).

The driving IC 220 is a component that is disposed on the base film 210 and processes data for displaying images and driving signals for processing the data. Further, the driving ICs 220 connected to the stretch sensing lines may sense the degree of stretch of the lower substrate 110 and transmit a sensed stretch value to the controller, for example, a timing controller disposed on the printed circuit board 300 through the stretch sensing lines. Although the driving ICs 220 are shown as being mounted in a COF type in FIG. 1, the driving ICs 220 are not limited thereto and may be mounted in the type of Chip On Glass (COG) or Tape Carrier Package (TCP).

Controllers such as an IC chip and a circuit, for example, a timing controller may be mounted on the printed circuit board 300. In one embodiment, the printed circuit board 300 is rigid and does not stretch. Further, a memory, a processor, etc. also may be mounted on the printed circuit board 300. The printed circuit board 300 transmits signals for driving pixels from the controllers to the pixels. The printed circuit board 300 may create compensation data by comparing the stretch sensing value transmitted from the driving ICs 220 connected to the stretch sensing lines with a predetermined reference value.

The printed circuit board 300 may be electrically connected to each of the plurality of pixels disposed in the active area AA of the display panel 100 by being connected to the flexible connecting films 200.

The upper substrate 120 is a substrate overlapped with the lower substrate 110 to protect various components of the stretchable display device 1000. The upper substrate 120, which is a flexible substrate, may be made of a bendable, pliant or stretchable insulating material. For example, the upper substrate 120 may be made of a bendable, pliant or stretchable material and may be made of the same material as the first substrate 111 of the lower substrate 110, but is not limited thereto.

Though not shown in FIG. 1, the stretchable display device 1000 according to an embodiment of the present disclosure may further include a polarizing layer. The polarizing layer, which is a configuration suppressing external light reflection by the stretchable display device 1000, may be disposed on the upper substrate 120 while overlapping the upper substrate 120. However, the polarizing layer is not limited thereto and, may be disposed under the upper substrate 120, may be disposed under the lower substrate 110, or may be omitted, depending on the configuration of the stretchable display device 1000.

FIGS. 2 to 5 are referred to hereafter to describe in more detail the stretchable display device 1000 according to an embodiment of the present disclosure.

Figure 2:
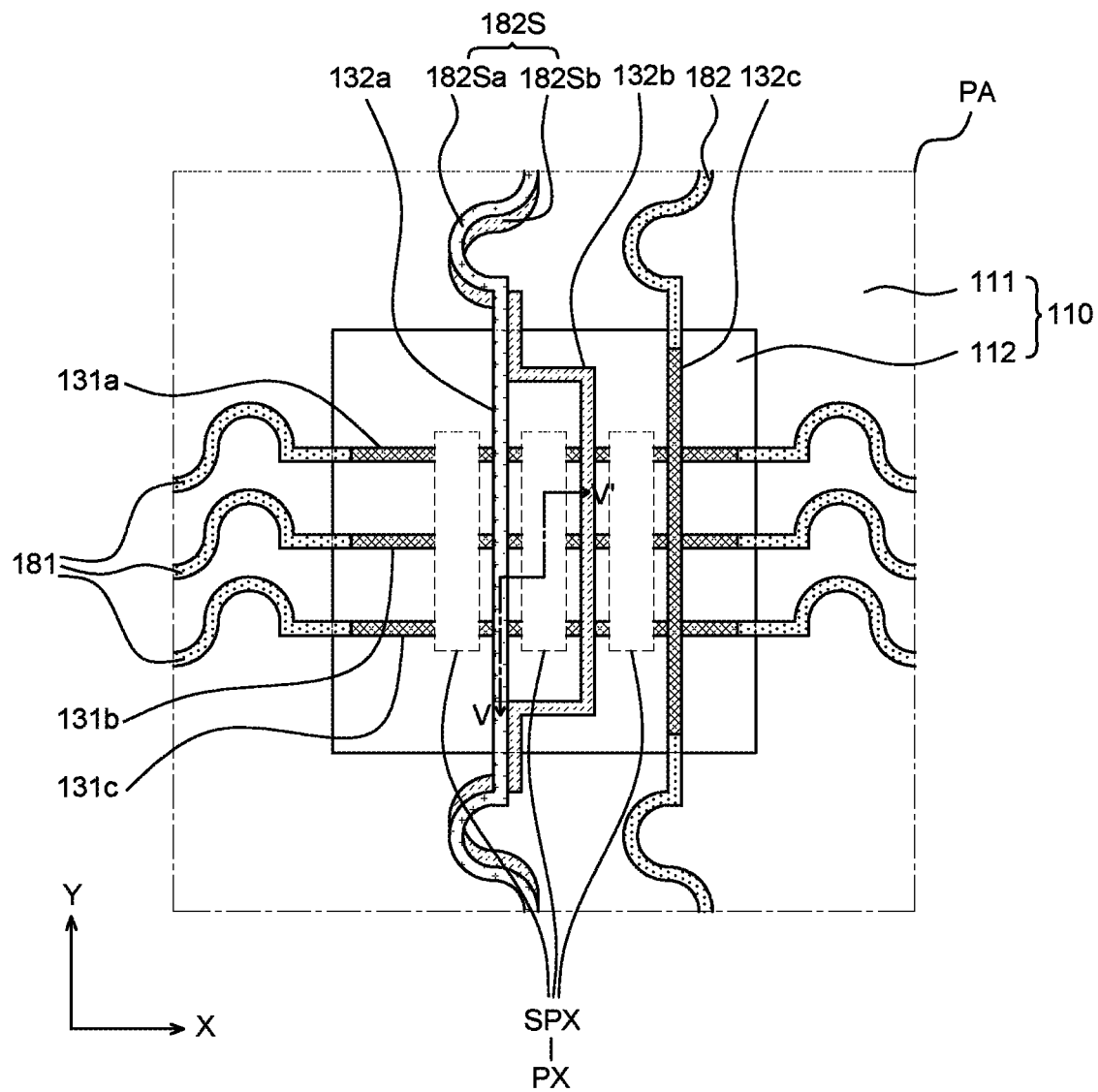
FIG. 2 is an enlarged plan view enlarging one pixel area disposed in a stretchable display device according to an embodiment of the present disclosure.
Figure 3:
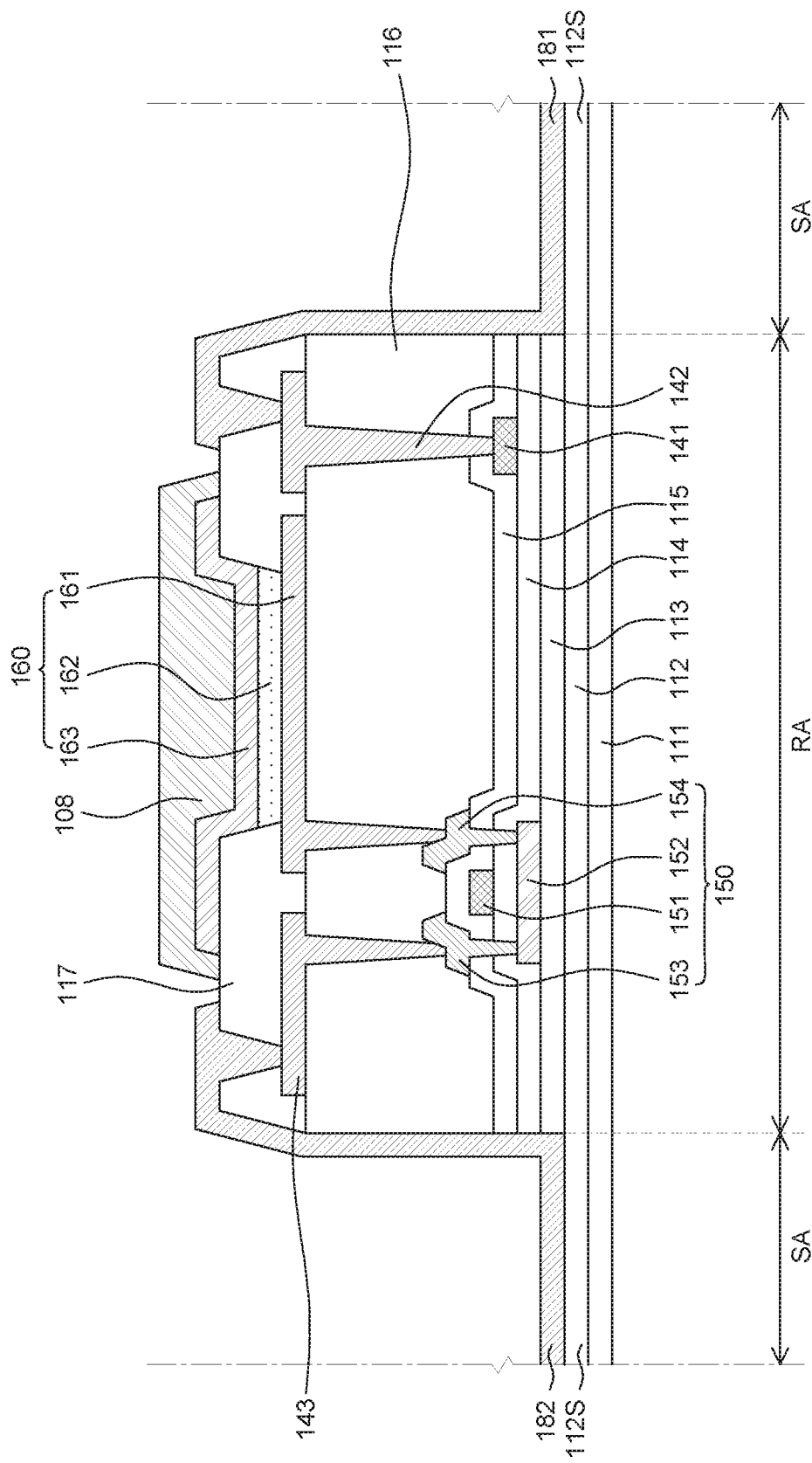
FIG. 3 is a schematic cross-sectional view of one subpixel of a stretchable display device according to an embodiment of the present disclosure.
Figure 4:
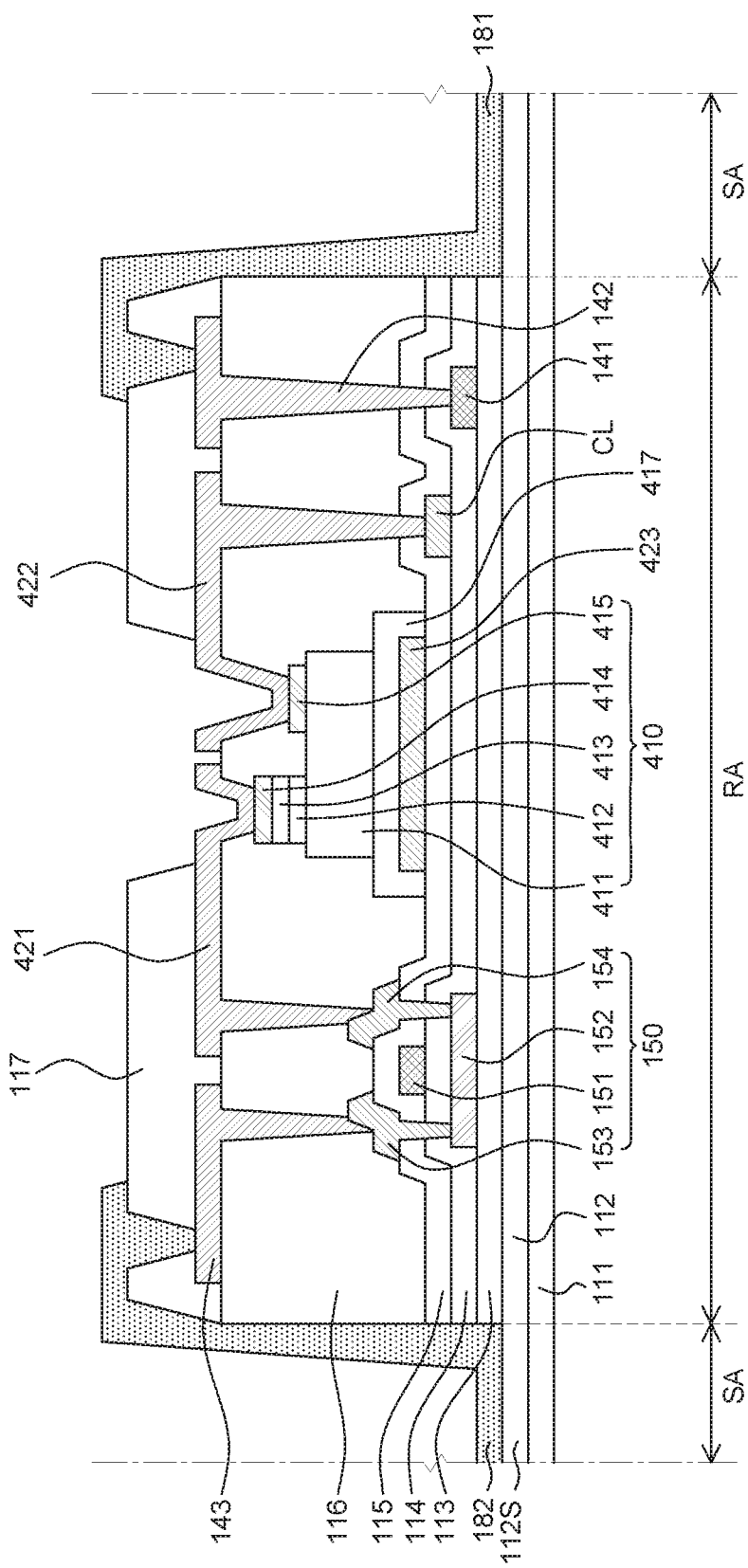
FIG. 4 is a schematic cross-sectional view of one subpixel of a stretchable display device according to another embodiment of the present disclosure.
Figure 5:
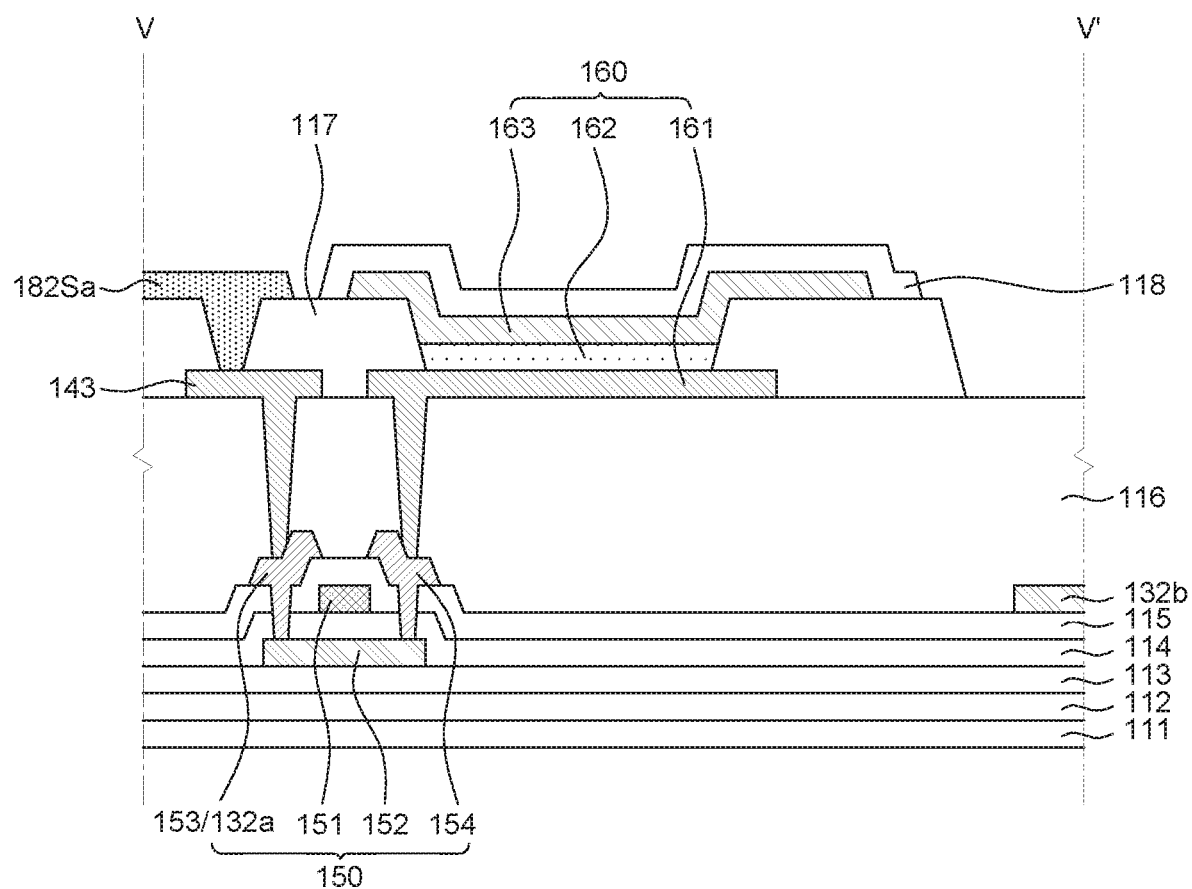
FIG. 5 is a schematic cross-sectional view taken along line V-V of FIG. 2.

FIG. 2 is an enlarged plan view enlarging one pixel area disposed in a stretchable display device according to an embodiment of the present disclosure. FIG. 3 is a schematic cross-sectional view of one subpixel of a stretchable display device according to an embodiment of the present disclosure. FIG. 4 is a schematic cross-sectional view of one subpixel of a stretchable display device according to another embodiment of the present disclosure. FIG. 5 is a schematic cross-sectional view taken along line V-V of FIG. 2.

First, referring to FIG. 2, a first substrate 111 made of a pliable material and a second substrate 112 made of a material that is more rigid than the first substrate 111 and disposed on the first substrate 111 are disposed in a pixel area PA of the stretchable display device 1000 according to an embodiment of the present disclosure.

A pixel PX including a light emitting element is disposed on the second substrate 112 in the pixel area PA and a plurality of connecting lines 180 connecting pixels PX disposed in a plurality of second substrates 112 to each other is disposed on the first substrate 111.

The pixels PX emit light having a specific wavelength band. For example, the pixels PX include sub-pixels SPX respectively emitting red, green, and blue light. Although three subpixels SPX emitting red, green, and blue light are described in an embodiment of the present disclosure, the present disclosure is not limited thereto. For example, the pixels PX may further include a subpixel emitting white light other than the subpixels SPX emitting red, green, and blue light. When a subpixel emitting white light is included, the stretchable display device 1000 according to an embodiment of the present disclosure may further include a color filter. The subpixels SPX each may include a thin film transistor and a light emitting element. The light emitting element may be any one of an organic light emitting element and a micro LED.

Referring to FIG. 3 to describe the structure of the subpixels SPX in more detail, a second substrate 112 on which a thin film transistor 150 and a light emitting element 160 are disposed is disposed in a predetermined area of the first substrate 111 of the lower substrate 110. As described above, the area where the second substrate 112 on which the thin film transistor 150 and the light emitting element 160 are disposed is disposed may be referred to as a rigid area RA and the areas where a first connecting line 181 and a second connecting line 182 are disposed may be referred to as pliable areas SA.

Referring to FIG. 3, a buffer layer 113 is disposed on the second substrate 112 of the rigid area RA. The buffer layer 113 may be made of an insulating material, and for example, may be made as a single inorganic layer or a multi-inorganic layer made of a silicon nitride (SiNx), a silicon oxide (SiOx), or silicon oxynitride (SiON).

The buffer layer 113 is disposed in an area overlapped with the second substrate 112 of the rigid area RA to protect various components of the stretchable display device 1000 against permeation of water, oxygen, etc. from the outside. This is because the buffer layer 113 may be made of an inorganic material, so they may be easily damaged, such as cracking, when the stretchable display device 1000 is stretched. Accordingly, the buffer layer 113 may be formed over the second substrate 112 of the rigid area RA by patterning similar to the shape of the second substrate 112 of the rigid area RA without being formed to the pliable areas SA that are the spacing area between a plurality of second substrates 112. Therefore, since the buffer layer 113 is formed in the area overlapped with the second substrate 112 of the rigid area RA, it is possible to suppress damage to the buffer layer 113 even though the stretchable display device 1000 according to an embodiment of the present disclosure is deformed, such as, bending or stretching. However, the buffer layer 113 may be omitted, depending on the structure or characteristics of the stretchable display device 1000.

Referring to FIG. 3, a transistor 150 including a gate electrode 151, an active layer 152, a source electrode 153, and a drain electrode 154 is formed on the buffer layer 113. For example, as for the process of forming the transistor 150, the active layer 152 is formed on the buffer layer 113, and a gate insulating layer 114 for insulating the active layer 152 and the gate electrode 152 from each other is formed on the active layer 152. An inter-layer insulating layer 115 is formed to insulate the gate electrode 151, the source electrode 153, and the drain electrode 154 from each other, and the source electrode 153 and the drain electrode 154 that are in contact with the active layer 152 are formed on the inter-layer insulating layer 115.

The gate insulating layer 114 and the inter-layer insulating layer 115 may be formed in the area overlapped with the second substrate 112 in the rigid region RA by patterning. The gate insulating layer 114 and the inter-layer insulating layer 115 may also be made of an inorganic material, equally to the buffer layer 113, so they may be easily damaged such as cracking when the stretchable display device 1000 is stretched. Accordingly, the gate insulating layer 114 and the inter-layer insulating layer 115 may be formed over the second substrate 112 of the rigid area RA by patterning similarly to the shape of the second substrate 112 of the rigid area RA without being formed in the areas between the second substrates 112 on which the thin film transistors 150 are disposed, that is, the pliable areas SA.

Only a driving thin film transistor of various thin film transistors that may be included in the stretchable display device 1000 is shown in FIG. 3 for the convenience of description, but a switching thin film transistor, a capacitor, etc. may be included in the display device. Further, although the thin film transistor 150 is described as having a coplanar structure in the present disclosure, it is not limited thereto various transistors, for example, having a staggered structure may be used.

Referring to FIG. 3, a gate pad 141 is disposed on the gate insulating layer 114. The gate pad 141 is a pad for transmitting a gate signal to a plurality of subpixels SPX. The gate pad 141 may be made of the same material as the gate electrode 151, but is not limited thereto.

Referring to FIG. 3, a planarization layer 116 is formed on the thin film transistor 150 and the inter-layer insulating layer 115. The planarization layer 116 planarizes the top of the thin film transistor 150. The planarization layer 116 may be composed of a single layer or a plurality of layers and may be made of an organic material. For example, the planarization layer 116 may be made of an acrylic-based organic material, but is not limited thereto. The planarization layer 116 may have a contact hole for electrically connecting the thin film transistor 150 and a first electrode 161 of the organic light emitting element 160, a contact hole for electrically connecting a data pad 143 and the source electrode 153, and a contact hole for electrically connecting a connecting pad 142 and a gate pad 141.

In some embodiments, a passivation layer may be formed between the thin film transistor 150 and the planarization layer 116. That is, a passivation layer covering the thin film transistor 150 may be formed to protect the thin film transistor 150 from permeation of water, oxygen, etc. The passivation layer may be made of an inorganic material and may be composed of a single layer or a multi-layer, but is not limited thereto.

Referring to FIG. 3, the data pad 143, the connecting pad 142, and the organic light emitting element 160 are disposed on the planarization layer 116.

The data pad 143 may transmit a data signal from a second connecting line 182, which functions as a data line, to a plurality of subpixels SPX. The data pad 143 is connected to the source electrode 153 of the thin film transistor 150 through a contact hole formed at the planarization layer 116. The data pad 143 may be made of the same material as the first electrode 161 of the organic light emitting element 160, but is not limited thereto. The data pad 143 may be made of the same material as the source electrode 153 and the drain electrode 154 of the thin film transistor 150, not on the planarization layer 116, but on the inter-layer insulating layer 115.

The connecting pad 142 and the gate pad 141 may transmit a gate signal from a first connecting line 181, which functions as a gate line, to a plurality of subpixels SPX. The connecting pad 142 is connected to the gate pad 141 through contact holes formed at the planarization layer 116 and the inter-layer insulating layer 115 and transmits a gate signal to the gate pad 141. The connecting pad 142 may be made of the same material as the data pad 143, but is not limited thereto.

The organic light emitting element 160 includes the first electrode 161, an organic light emitting layer 162, and a second electrode 163. In detail, the first electrode 161 is disposed on the planarization layer 116. The first electrode 161 is an electrode configured to supply holes to the organic light emitting layer 162. The first electrode 161 may be made of a transparent conductive material with a high work function. The transparent conductive material may include an Indium Tin Oxide (ITO), an Indium Zinc Oxide (IZO), and an Indium Tin Zinc Oxide (ITZO). The first electrode 161 may be made of the same material as the data pad 143 and the gate pad 141 disposed on the planarization layer 116, but is not limited thereto. When the stretchable display device 1000 is implemented in a top emission type, the first electrode 161 may further include a reflective plate. Further, the first electrode 161 may reflect light emitted from the organic light emitting layer 162 and may be made of magnesium (Mg), calcium (Ca), aluminum (Al), silver (Ag) which have a lower work function than the second electrode 163, or an alloy thereof.

The first electrodes 161 are spaced and disposed respectively for subpixels SPX and electrically connected to the thin film transistor 150 though a contact hole of the polarization layer 116. For example, although the first electrode 161 is electrically connected to the drain electrode 154 of the transistor 150 in FIG. 3, it may be electrically connected to the source electrode 153.

A bank 117 is formed on the first electrode 161, the data pad 143, the connecting pad 142, and the planarization layer 116. The bank 117 is a component separating adjacent subpixels SPX. The bank 117 is disposed to cover at least partially both sides of adjacent first electrode 161, thereby partially exposing the tops of the first electrode 161. The bank 117 may suppress the problem that an unexpected subpixel SPX emits light or colors are mixed by light emitted in the lateral direction of the first electrode 161 due to concentration of a current on the edge of the first electrode 161. The bank 117 may be made of acrylic-based resin, benzocyclobutene (BCB)-based resin, or polyimide, but is not limited thereto.

The bank 117 has a contact hole for connecting the second connecting line 182 and the data pad 143 and a contact hole for connecting the first connecting line 181 functioning as a gate line and the connecting pad 142.

The organic light emitting layer 162 is disposed on the first electrode 161. The organic light emitting layer 162 is configured to emit light. The organic light emitting layer 162 may include a luminescent material, and the luminescent material may include a phosphorous material of a fluorescent material, but is not limited thereto.

The organic light emitting layer 162 may be composed of one light emitting layer. Alternatively, the organic light emitting layer 162 may have a stacked structure in which a plurality of light emitting layers is stacked with a charge generation layer therebetween. The organic light emitting layer 162 may further include at least one organic layer of a whole transporting layer, an electron transporting layer, a hole blocking layer, an electron blocking layer, a hole injection layer, and an electron injection layer.

Referring to FIG. 3, the second electrode 163 is disposed on the organic light emitting layer 162. The second electrode 163 supplies electrons to the organic light emitting layer 162. The second electrode 163 may be made of a material having a work function different from the material of the first electrode 161. The second electrode 163, for example, may be made of Indium Tin Oxide (ITO)-based, Indium Zinc Oxide (IZO)-based, Indium Tin Zinc Oxide (ITZO)-based, Zinc Oxide (ZnO)-based, and Tin Oxide (TO)-based transparent conductive oxides or an Ytterbium (Yb) alloy. Alternatively, the second electrode 163 may be made of a metal material.

Further, when the stretchable display device 1000 is implemented in a top emission type, the second electrode 163 may further include a reflective plate.

Further, the second electrode 163 may reflect light emitted from the organic light emitting layer 162 and may be made of magnesium (Mg), calcium (Ca), aluminum (Al), silver (Ag) which have a lower work function than the first electrode 161, or an alloy thereof. The second electrode 163 may be formed by patterning to overlap each of the second substrates 112 of the rigid areas RA. That is, the second electrode 163 is formed in the areas overlapped with the second substrates 112 of the rigid areas RA and may be disposed not to be formed in the pliable areas SA. Since the second electrode 163 is made of a material, such as a transparent conductive oxide, a transparent metal material, a reflective metal material, and the like, when the second electrode 163 is formed in the areas between second substrates 112 on which the organic light emitting elements 160 are disposed, that is, is formed even in the pliable areas SA, the second electrode 163 may be damaged when the stretchable display device 1000 is stretched and contracted. The second electrode 163 may be formed to respectively correspond to the second substrates 112 of the rigid areas RA in a plane. The second electrode 163 may be formed to have an area not overlapped with the areas where the connecting lines 180 are formed of the areas overlapped with the second substrates 112 in the rigid areas RA.

Though not shown in FIG. 3, an insulating layer for insulation between two sensing lines constituting the stretch sensing lines disposed by extending from the pliable area SA may be further disposed on the organic light emitting element 160.

Referring to FIG. 3, an encapsulation layer 108 is disposed on the organic light emitting element 160. The encapsulation layer 108 may seal the organic light emitting element 160 by covering the organic light emitting element 160 in contact with a portion of the top of the bank 117. Accordingly, the encapsulation layer 108 protects the organic light emitting element 160 from water, air, or physical shock that may permeate from the outside.

The encapsulation layers 108 respectively cover the second electrode 163 patterned to respectively overlap the second substrates 112 of the rigid areas RA and may be formed on the second substrates 112, respectively. That is, the encapsulation layers 108 are disposed to each cover one second electrode 163 on one second substrate 112 and the encapsulation layer 108 disposed on each of the second substrates 112 of the rigid areas RA may be spaced apart from each other.

The encapsulation layer 108 may be formed in the areas overlapped with the second substrates 112 of the rigid areas RA. As described above, since the encapsulation layers 108 may be configured to include an inorganic layer, they may be easily damaged, such as cracking, when the stretchable display device 1000 is stretched. In particular, since the organic light emitting element 160 is vulnerable to water or oxygen, when the encapsulation layer 108 is damaged, reliability of the organic light emitting element 160 may be reduced. Therefore, since the encapsulation layer 108 is not formed in the pliable areas SA, damage to the encapsulation layer 108 may be minimized even though the stretchable display device 1000 according to an embodiment of the present disclosure is deformed, such as, bending or stretching.

However, if necessary, the encapsulation layer 108 may be formed on the front surface of the lower substrate 110 including the rigid areas RA and the pliable areas SA.

Compared with common flexible organic light emitting display devices of the related art, the stretchable display device 1000 according to an embodiment of the present disclosure has a structure in which the plurality of second substrates 112 that is relatively rigid is spaced apart from each other and disposed on the first substrate 111 that is relatively pliable. The second electrode 163 and the encapsulation layers 108 of the stretchable display device 1000 are disposed by patterning to correspond to the plurality of second substrates 112, respectively. That is, the stretchable display device 1000 according to an embodiment of the present disclosure may have a structure that enables the stretchable display device 1000 to be more easily deformed when a user stretches or bends the stretchable display device 1000 and may have a structure that may minimize damage to the constituting components of the stretchable display device 1000 when the stretchable display device 1000 is deformed.

The lower substrate 110 configured in this way may be bonded to the upper substrate 120 shown in FIG. 1 by an adhesive layer (not shown).

Meanwhile, although an organic light emitting element is exemplified as a light emitting element in FIG. 3, the light emitting elements of the stretchable display device 1000 may be micro LEDs. The structure of one subpixel when the light emitting elements of the stretchable display device 1000 according to an embodiment of the present disclosure are micro LEDs is described hereafter.

Referring to FIG. 4, a common line CL is disposed on the gate insulating layer 114. The common line CL is a line applying a common voltage to a plurality of subpixels SPX. The common line CL may be made of the same material as the source electrode 153 and the drain electrode 154 of the thin film transistor 150, but is not limited thereto. For example, the common line CL may also be made of the same material as the gate electrode 151 of the thin film transistor 150.

A reflective layer 423 is disposed on the inter-layer insulating layer 115. The reflective layer 423 is a layer for discharging light, which is emitted to the first substrate 111 of light emitting from the micro LED 410, to the outside by reflecting the light upward a stretchable display device 1000. The reflective layer 423 may be made of a metal material having high reflectance.

A first adhesive layer 417 is disposed on the reflective layer 423 to cover the reflective layer 423. The first adhesive layer 417, which is a layer for bonding the micro LED 410 on the reflective layer 423, may insulate the reflective layer 423 made of a metal material and the micro LED 410 from each other. The first adhesive layer 417 may be made of a thermosetting material or a photocuring material, but is not limited thereto. Although the first adhesive layer 417 covers only the reflective layer 423 in FIG. 4, the disposition position of the first adhesive layer 417 is not limited thereto.

The micro LED 410 is disposed on the first adhesive layer 417. The micro LED 410 is disposed while overlapping the reflective layer 423. The micro LED 410 includes an n-type layer 411, an active layer 412, a p-type layer 413, a p-electrode 414, and an n-electrode 415. The micro LED 410 is described as a micro LED 410 of a lateral structure hereafter, but the structure of the micro LED 410 is not limited thereto. For example, a micro LED of a flip chip structure may be used as the micro LED 410.

In detail, the n-type layer 411 of the micro LED 410 is disposed while overlapping the reflective layer 423 on the first adhesive layer 417. The n-type layer 411 may be formed by injecting an n-type impurity into a gallium nitride having excellent crystallinity. The active layer 412 is disposed on the n-type layer 411. The active layer 412, which is a light emitting layer that emits light in the micro LED 410, may be made of a nitride semiconductor, for example, an indium gallium nitride. The p-type layer 413 is disposed on the active layer 412. The p-type layer 413 may be formed by injecting a p-type impurity into a gallium nitride. However, the configuration materials of the n-type layer 411, the active layer 412, and the p-type layer 413 are not limited thereto.

The p-electrode 414 is disposed on the p-type layer 413 of the micro LED 410. The n-electrode 415 is disposed on the n-type layer 411 of the micro LED 410. The n-electrode 415 is spaced and disposed apart from the p-electrode 414. In detail, the micro LED 410 may be manufactured by sequentially stacking the n-type layer 411, the active layer 412, and the p-type layer 413, etching a predetermined portion of the active layer 412 and the p-type layer 413, and then forming the n-electrode 415 and the p-electrode 414. In some embodiments, the predetermined portion is a space for spacing the n-electrode 415 and the p-electrode 414 and the predetermined portion may be etched to expose a portion of the n-type layer 411. In other words, the surface of the micro LED 410 where the n-electrode 415 and the p-electrode 415 are disposed is not a planarized surface and may have different levels. Accordingly, the p-electrode 414 is disposed on the p-type layer 413, the n-electrode 415 is disposed on the n-type layer 411, and the p-electrode 414 and the n-electrode 415 are spaced and disposed apart from each other at different levels. Therefore, the n-electrode 415 may be disposed more adjacent to the reflective layer 423 in comparison to the p-electrode 414. The n-electrode 415 and p-electrode 414 may be made of a conductive material, for example, a transparent conductive oxide. Alternatively, the n-electrode 415 and p-electrode 414 may be made of the same material, but are not limited thereto.

A planarization layer 116 is disposed on the inter-layer insulating layer 114 and the first adhesive layer 417. The planarization layer 116 is a layer that planarizes the top of the thin film transistor 150. The planarization layer 116 may be disposed to planarize the top of the planarization layer 116 in an area excepting the area where the micro LED 410 is disposed. The planarization layer 116 may be composed of two or more layers.

A first electrode 421 and a second electrode 422 are disposed on the planarization layer 116. The first electrode 421 is an electrode that electrically connects the thin film transistor 150 and the micro LED 410. The first electrode 421 is connected to the p-electrode 414 of the micro LED 410 through a contact hole formed at the planarization layer 116. The first electrode 421 is connected to the drain electrode 154 of the thin film transistor 150 through contact holes formed at the planarization layer 116 and the inter-layer insulating layer 115. However, the first electrode 421 is not limited thereto and may be connected to the source electrode 153 of the thin film transistor 150, depending on the type of the thin film transistor 150. The p-electrode 414 of the micro LED 410 and the drain electrode 154 of the thin film transistor 150 may be electrically connected by the first electrode 421.

The second electrode 422 is an electrode that electrically connects the micro LED 410 and the common line CL. In detail, the second electrode 422 is connected to the common line CL through contact holes formed at the planarization layer 116 and the inter-layer insulating layer 115 and is connected to the n-electrode 415 of the micro LED 410 through a contact hole formed at the planarization layer 116. Accordingly, the common line CL and the n-electrode 415 of the micro LED 410 are electrically connected.

When the stretchable display device 1000 is turned on, voltages having different levels may be supplied respectively to the drain electrode 154 of the thin film transistor 150 and the common line CL. The voltage that is applied to the drain electrode 154 of the thin film transistor 150 may be applied to the first electrode 421 and a common voltage may be applied to the second electrode 422. Voltages having different levels may be applied to the p-electrode 414 and the n-electrode 415 through the first electrode 421 and the second electrode 422, so the micro LED 410 may emit light.

Although the thin film transistor 150 is described as being electrically connected to the p-electrode 414 and the common line CL is described as being electrically connected to the n-electrode 415 in FIG. 4, they are not limited thereto. That is, the thin film transistor 150 may be electrically connected to the n-electrode 415 and the common line CL may be electrically connected to the p-electrode 414.

A bank 117 is disposed on the planarization layer 116, the first electrode 421, the second electrode 422, the data pad 143, and the connecting pad 142. The bank 117 may be disposed to overlap an end of the reflective layer 423 and a portion not overlapped with the bank 117 of the reflective layer 423 may be defined as a light emitting area. The bank 117 may be made of an organic insulating material and may be made of the same material as the planarization layer 116. The bank 117 may be configured to include a black material to suppress a color mixing phenomenon due to light emitted from the micro LED 410 and transmitted to an adjacent subpixel SPX.

As described above, the light emitting elements of the stretchable display device 1000 according to an embodiment of the present disclosure may be organic light emitting elements, but also may be micro LEDs 410. Since the micro LED 410 is made of not an organic material, but an inorganic material, reliability is excellent, so the lifespan is longer than that of a liquid crystal light emitting element or an organic light emitting element. The micro LED 410 has a quick turning speed, has small power consumption, has excellent stability because it has strong shock-resistance, and may display high-luminance images because it has excellent emission efficiency. Accordingly, the micro LED 410 is an element that is suitable to be applied even to very large screens. In particular, since the micro LED 410 is made of not an organic material, but an inorganic material, an encapsulation layer that is required when an organic light emitting element is used may not be used. Accordingly, the encapsulation layer that may be easily damaged, such as cracking, when the stretchable display device 1000 is stretched may be omitted. Accordingly, it is possible to omit use of an encapsulation layer that may be damaged when the stretchable display device 1000 according to another embodiment of the present disclosure is deformed such as bending or stretching, by using the micro LED 410 as a light emitting element in the stretchable display device 1000. Further, since the micro LED 410 is made of not an organic material, but an inorganic material, the emitting elements of the stretchable display device 1000 according to another embodiment of the present disclosure may be protected from water or oxygen and their reliability may be excellent.

Meanwhile, referring to FIGS. 3 and 4, the first connecting line 181 and the second connecting line 182 each are connected to the gate pad 141 and the connecting pad 142 or the data pad 143 disposed on the second substrate 112 of the rigid area RA and may be extended and disposed to the pliable areas SA. In some embodiments, a line damage suppression layer 112S may be disposed under the first connecting line 181 and the second connecting line 182 disposed on the pliable areas SA.

The line damage suppression layer 112S may be disposed on the first substrate 111 in correspondence to the shape of the first connecting line 181 and the second connecting line 182 disposed on the pliable areas SA. That is, when the first connecting line 181 and the second connecting line 182 have a wavy shape, the line damage suppression layer 112S may correspondingly have a wavy shape, and when the first connecting line 181 and the second connecting line 182 have a straight shape, the line damage suppression layer 112S may correspondingly have a straight shape. For example, the shape of the line damage suppression layer 112S formed on the first substrate 111 may substantially follow the shape of the first connecting line 181 and the second connecting line 182. The line damage suppression layer 112S may be made of the same material as the second substrate 112 disposed in the rigid area RA. The line damage suppression layer 112S, for example, may include silicon rubber such as polydimethylsiloxane (PDMS), an elastomer such as polyurethane (PU), styrene butadiene styrene (SBS), etc. Accordingly, by disposing the line damage suppression layer 112S under the connecting line 180 disposed in the pliable areas SA in the stretchable display device 1000 according to an embodiment of the present disclosure, it is possible to suppress damage to the connecting line 180 and control overstretching of the lower substrate 110 when the stretchable display device 1000 is stretched.

Referring to FIGS. 2 and 3, a plurality of connecting lines 180 for electrically connecting a second substrate 112 and another second substrate 112 disposed adjacent to the second substrate 112 are disposed on the first substrate 111. The plurality of connecting lines 180 include a plurality of first connecting lines 181 disposed in the first direction X and a plurality of second connecting lines 182 disposed in the second direction Y.

The plurality of first connecting lines 181 each may be electrically connected to a gate line 131a, a high-potential power line 131b, and a low-potential power line 131c disposed on the second substrate 112. The plurality of first connecting lines 181 may have a curved shape, that is, a wavy shape to correspond to stretching of the lower substrate 110. For example, a curved shape means wave shape or a diamond shape. The plurality of first connecting lines 181, for example, may be made of a metal material such as copper (Cu), silver (Ag), and gold (Au). Accordingly, even though the first connecting lines 181 are made of a metal material, the first connecting lines 181 extend to have a curved shape on the first substrate 111, whereby damage to the plurality of first connecting lines 181 may be minimized even though the stretchable display device 1000 is stretched.

The plurality of second connecting lines 182 each may be electrically connected to first to third data lines 132*a*, 132*b*, and 132*c* disposed on the second substrate 112. The plurality of second connecting lines 182 may have a curved shape, that is, a wavy shape to correspond to stretching of the lower substrate 110. The plurality of second connecting lines 182, for example, may be made of a metal material such as copper (Cu), silver (Ag), and gold (Au). Accordingly, even though the plurality of second connecting lines 182 is made of a metal material, the second connecting lines 182 extend to have a curved shape on the first substrate 111, whereby damage to the second connecting lines 182 may be minimized even though the stretchable display device 1000 is stretched.

Any one second connecting line 182S (hereafter, referred to as a 'second stretch sensing line') of the plurality of second connecting lines 182 may sense the degree of stretch of the lower substrate 110 while performing a function that transmits a data signal. Accordingly, the second stretch sensing line 182S may be electrically connected to first and second data lines 132*a* and 132*b* disposed on the second substrate 112.

The second stretch sensing line 182S may include a second stretch sensing Rx line 182Sa (which may be referred as an Rx line) and a second stretch sensing Tx line 182Sb that may sense the degree of stretch. Accordingly, the second stretch sensing Rx line 182Sa and the second stretch sensing Tx line 182Sb that are configured to be able to sense the degree of stretch of the lower substrate 110 are disposed in the second stretch sensing line 182S that is any one connecting line of the plurality of connecting lines 180 in the stretchable display device 1000 according to an embodiment of the present disclosure. Therefore, it is possible to find out the degree of stretch of the lower substrate 110 by sensing capacitance C between the second stretch sensing Rx line 182Sa and the second stretch sensing Tx line 182Sb before stretching and between the second stretch sensing Rx line 182Sa and the second stretch sensing Tx line 182Sb after stretching and determining a difference of the capacitance C before and after stretching.

Referring to FIG. 2, a gate line 131*a* for transmitting a gate signal to each subpixel SPX, a high-potential power line 131*b* for transmitting high-potential power to each subpixel SPX, a low-potential power line 131*c* for transmitting low-potential power to each subpixel SPX, and first to third data lines 132*a*, 132*b*, and 132*c* for transmitting a data signal to each subpixel SPX are disposed on the second substrate 112.

The gate line 131*a*, the high-potential power line 131*b*, and low-potential power line 131*c* are disposed in the first direction X on the second substrate 112 and may be electrically connected to a plurality of first connecting lines 181 disposed in the first direction X on the first substrate 111.

The first to third data lines 132*a*, 132*b*, and 132*c* are disposed in the second direction Y on the second substrate 112 and may be electrically connected to a plurality of second connecting lines 182 disposed in the second direction Y on the first substrate 111. In particular, the first data line 132*a* may be electrically connected to the second stretch sensing Rx line 182Sa extending from the second stretch sensing line 182S disposed on the first substrate 111. The second data line 132*b* may be electrically connected to the second stretch sensing Tx line 182Sb extending from the second stretch sensing line 182S disposed on the first substrate 111. Accordingly, the second stretch sensing Rx line 182Sa may be the first data line 132*a* on the second substrate 112 and the second stretch sensing Tx line 182Sb may be the second data line 132*b* on the second substrate 112. In some embodiments, the first data line 132*a* is a line supplying a data signal to any one subpixel SPX and the second data line 132*b* is a line supplying a data signal to another subpixel SPX disposed adjacent to the any one subpixel SPX. That is, the second stretch sensing Rx line 182Sa and the second stretch sensing Tx line 182Sb constituting the second stretch sensing line 182S on the first substrate 111 may sense the degree of stretch according to stretch of the first substrate 111. The second stretch sensing Rx line 182Sa and the second stretch sensing Tx line 182Sb constituting the second stretch sensing line 182S on the second substrate 112 may transmit a data signal. Further, the second stretch sensing Rx line 182Sa and the second stretch sensing Tx line 182Sb constituting the second stretch sensing line 182S each function as a data line supplying data to two subpixels, whereby it is possible to increase area utilization by reducing the number of connecting lines disposed on the first substrate 111.

Referring to FIG. 5, the second stretch sensing Rx line 182Sa of the second stretch sensing line 182S disposed on the first substrate 111 is electrically connected to the first data line 132*a* transmitting a data signal to a corresponding subpixel by the data pad 143. Further, the second stretch sensing Tx line 182Sb of the second stretch sensing line 182S disposed on the first substrate 111 is electrically connected to the second data line 132*b* of a subpixel adjacent to the subpixel connected to the first data line 132*a*. Accordingly, the second stretch sensing Rx line 182Sa of the second stretch sensing line 182S may transmit a data signal to any one subpixel and the second stretch sensing Tx line 182Sb may transmit a data signal to a subpixel adjacent to the any one subpixel.

As such, when the second stretch sensing line 182S plays both roles as a data line and stretch sensing line, the second stretch sensing line 182S may be configured to transmit a data signal in a period in which a data signal is applied, and senses the degree of stretch of the first substrate 111 in a period in which a data signal is not applied.

Such a stretchable display device 1000 according to an embodiment of the present disclosure is configured such that any one second connecting line 182S of the plurality of connecting lines 180, particularly, the plurality of second connecting lines 182 includes the second stretch sensing Rx line 182Sa and the second stretch sensing Tx line 182Sb. Accordingly, when the first substrate 111 is stretched, the degree of stretch is sensed using the capacitance between the second stretch sensing Rx line 182Sa and the second stretch sensing Tx line 182Sb. Further, by connecting each of the second stretch sensing Rx line 182Sa and the second stretch sensing Tx line 182Sb to each of the first data line 132*a* and the second data line 132*b* disposed on the second substrate 112, it is possible to reduce the area of the second connecting line 182S disposed on the first substrate 111.

Meanwhile, as described above, the case when at least one connecting line 182S of the plurality of connecting lines 180 may transmit a data signal to a subpixel SPX and sense the degree of stretch of the first substrate 111 is described as an embodiment. However, the stretchable display device 1000 according to an embodiment of the present disclosure is not limited thereto and may be configured to be able to transmit a gate signal and play a role that may sense the degree of stretch of the first substrate 111. As such, an embodiment about a stretch sensing line that plays roles as a gate line and stretch sensing is described next in more detail with reference to FIGS. 6 and 7.

Figure 6:
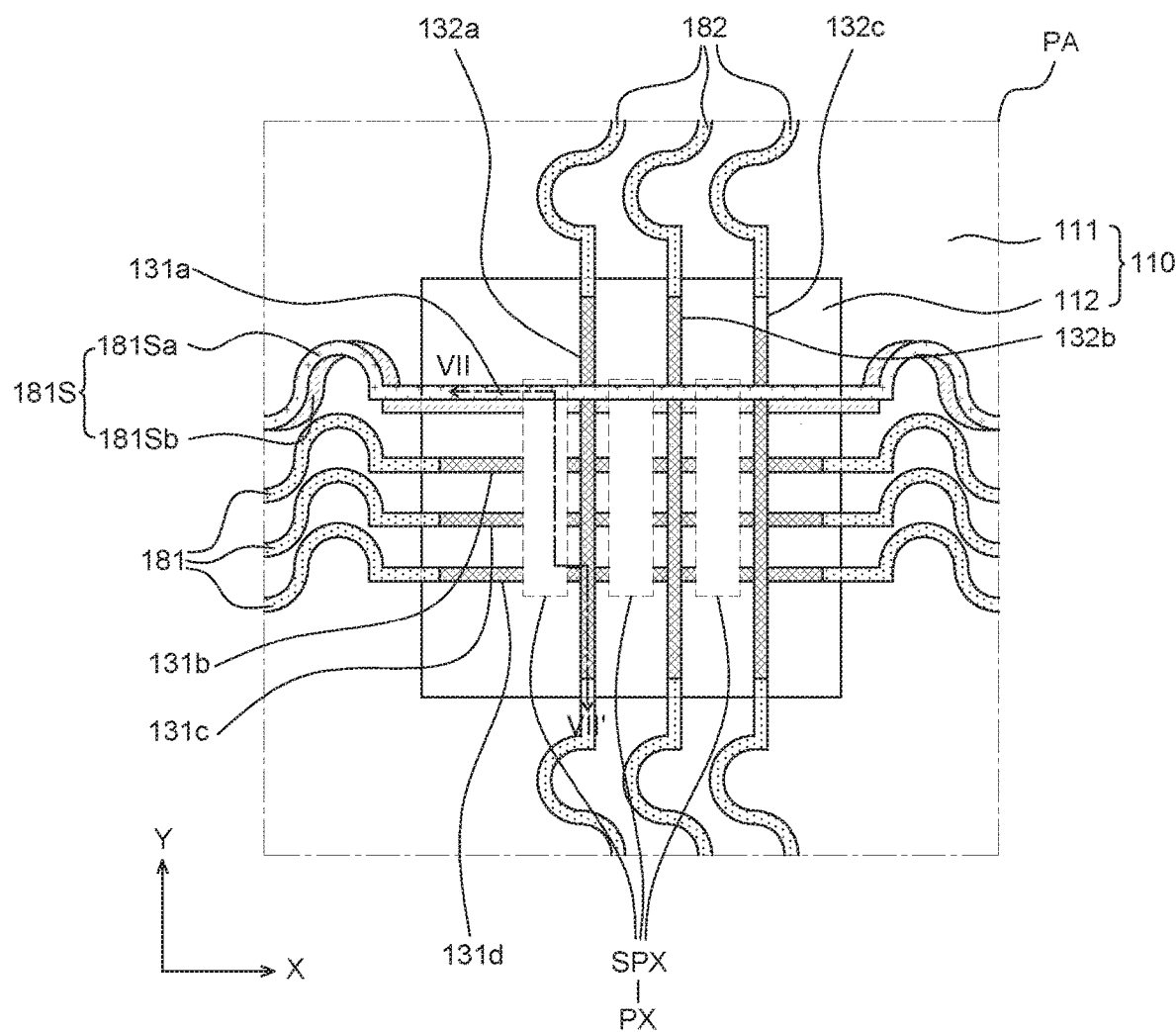
FIG. 6 is an enlarged plan view enlarging one pixel area disposed in a stretchable display device according to another embodiment of the present disclosure.
Figure 7:
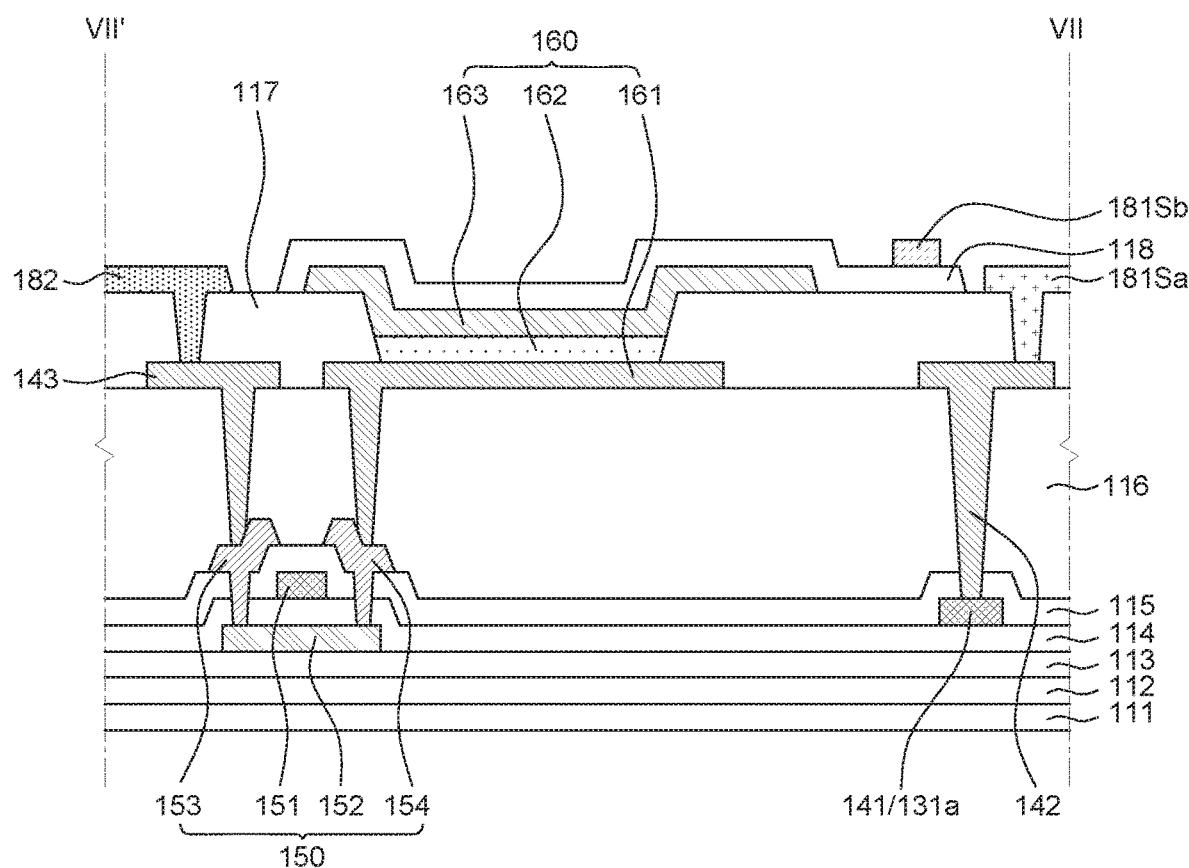
FIG. 7 is a schematic cross-sectional view taken along line VII-VII' of FIG. 6.

FIG. 6 is an enlarged plan view enlarging one pixel area disposed in a stretchable display device according to another embodiment of the present disclosure. FIG. 7 is a schematic cross-sectional view taken along line VII-VII' of FIG. 6.

Before looking into FIGS. 6 and 7, the structure of one subpixel shown in FIGS. 6 and 7, as compared with the subpixel structure shown in FIGS. 2 and 5, is different only in the disposition position of the stretch sensing line and is the same in substantial configuration, so repeated description for the same reference numerals is omitted.

First, referring to FIG. 6, a first stretch sensing line 181S of a plurality of connecting lines 180 disposed on a first substrate 111 may be disposed to extend in a first direction X. That is, at least any one of a plurality of first connecting lines 181 extending in the first direction X may be the first stretch sensing line 181S.

The first stretch sensing line 181S may include a first stretch sensing Rx line 181Sa (which may be referred as an Rx line) and a first stretch sensing Tx line 181Sb that may sense the degree of stretch.

Referring to FIG. 6, first and second gate lines 131a and 131b for transmitting a gate signal to each subpixel SPX, a high-potential power line 131c for transmitting high-potential power to each subpixel SPX, a low-potential power line 131d for transmitting low-potential power to each subpixel SPX, and first to third data lines 132a, 132b, and 132c for transmitting a data signal to each subpixel SPX are disposed on a second substrate 112. Here, the first and second gate lines 131a and 131b may be lines respectively transmitting a first scan signal and a second scan signal in accordance with each subpixel.

Referring to FIG. 6, the first stretch sensing line 181S disposed on the first substrate 111 is disposed on the first gate line 131a, and any one of a first stretch sensing Rx line 181Sa and a first stretch sensing Tx line 181Sb constituting the first stretch sensing line 181S may be electrically connected to the first gate line 131a.

Referring to FIG. 7, the first stretch sensing Rx line 181Sa of the first stretch sensing line 181S disposed on the first substrate 111 is electrically connected to the first gate line 131a transmitting a first gate signal to each subpixel through a connecting pad 142. Accordingly, the first connecting line 181S including the first stretch sensing Rx line 181Sa may play a role of a gate line transmitting the first gate signal. Further, the first stretch sensing Tx line 181Sb of the first stretch sensing line 181S disposed on the first substrate 111 may be disposed on an insulating layer 118 positioned at a higher level than the first stretch sensing Rx line 181Sa. That is, the first stretch sensing Rx line 181Sa and the first stretch sensing Tx line 181Sb may be disposed at different levels. An insulating layer may be interposed between the first stretch sensing Rx line 181Sa and the first stretch sensing Tx line 181Sb. In some embodiments, the insulating layer 118 may be an inorganic layer that is a partial configuration of an encapsulation layer 108 of a subpixel.

As such, the first stretch sensing line 181S including the first stretch sensing Rx line 181Sa and the first stretch sensing Tx line 181Sb that may sense the degree of stretch by a capacitance difference before and after stretching is disposed in the first direction X that is the same as the direction in which a gate line extends in the stretchable display device according to an embodiment of the present disclosure. Accordingly, it is possible to sense the degree of stretch in the first direction X by comparing the capacitance values between the first stretch sensing Rx line 181Sa and the first stretch sensing Tx line 181Sb before and after stretching when the first substrate 111 is stretched in the first direction X.

Meanwhile, the first gate line 131a and the first stretch sensing Rx line 181Sa of the first stretch sensing line 181S are described as being electrically connected in FIG. 7. However, a first stretch sensing line 181S may be additionally disposed in the first direction X to perform a stretch sensing function separately from the gate line disposed on a second substrate 112.

Further, a stretch sensing line may be separately disposed not only in the first direction X, but also in the second direction Y.

As such, an embodiment when a stretch sensing line that may sense stretch is additionally disposed is described next in detail with reference to FIGS. 8 and 9.

Figure 8:
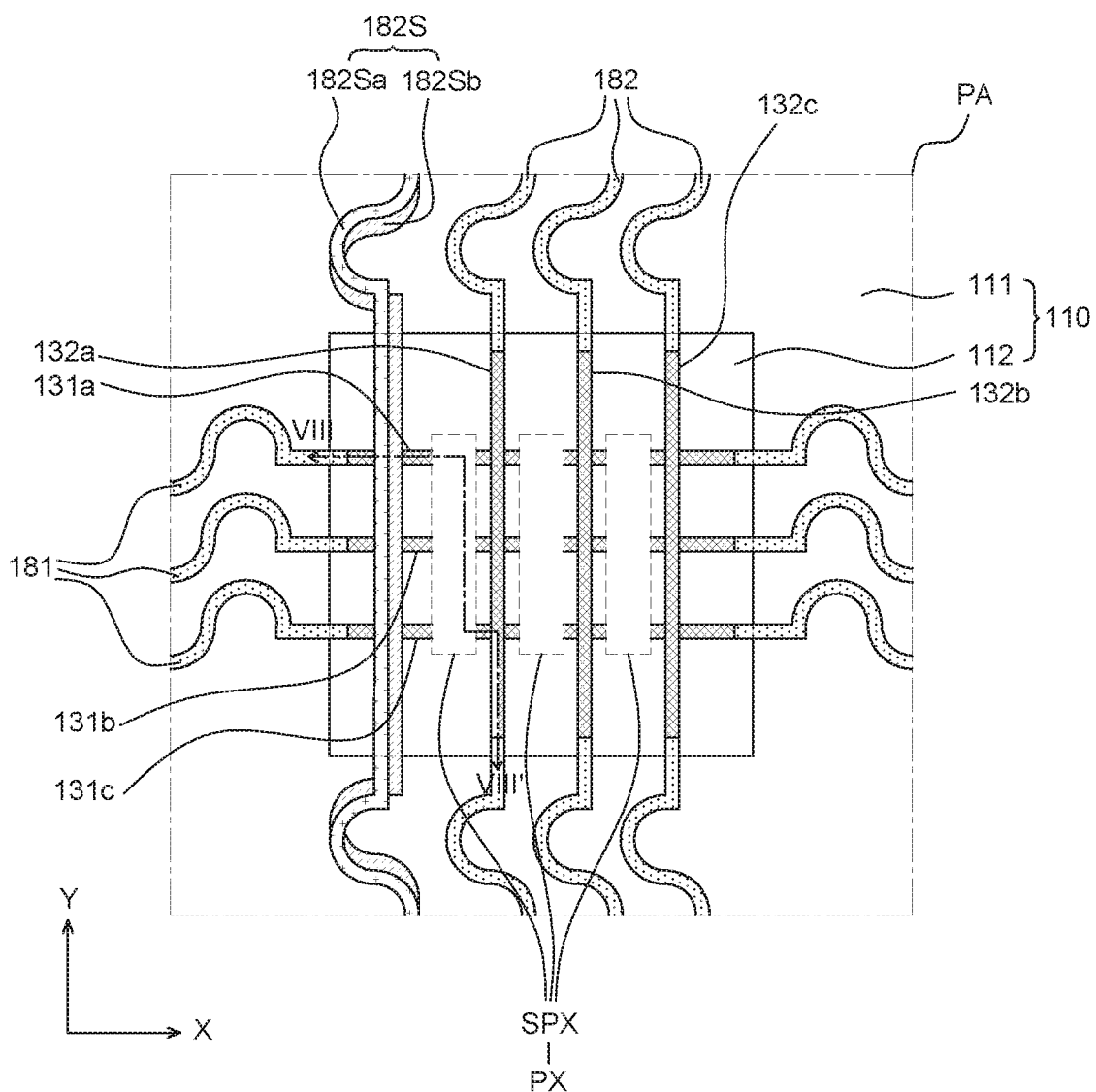
FIG. 8 is an enlarged plan view enlarging one pixel area disposed in a stretchable display device according to another embodiment of the present disclosure.

FIG. 8 is an enlarged plan view enlarging one pixel area disposed in a stretchable display device according to another embodiment of the present disclosure. FIG. 9 is a schematic cross-sectional view taken along line VIII-VIII' of FIG. 8.

Figure 9:
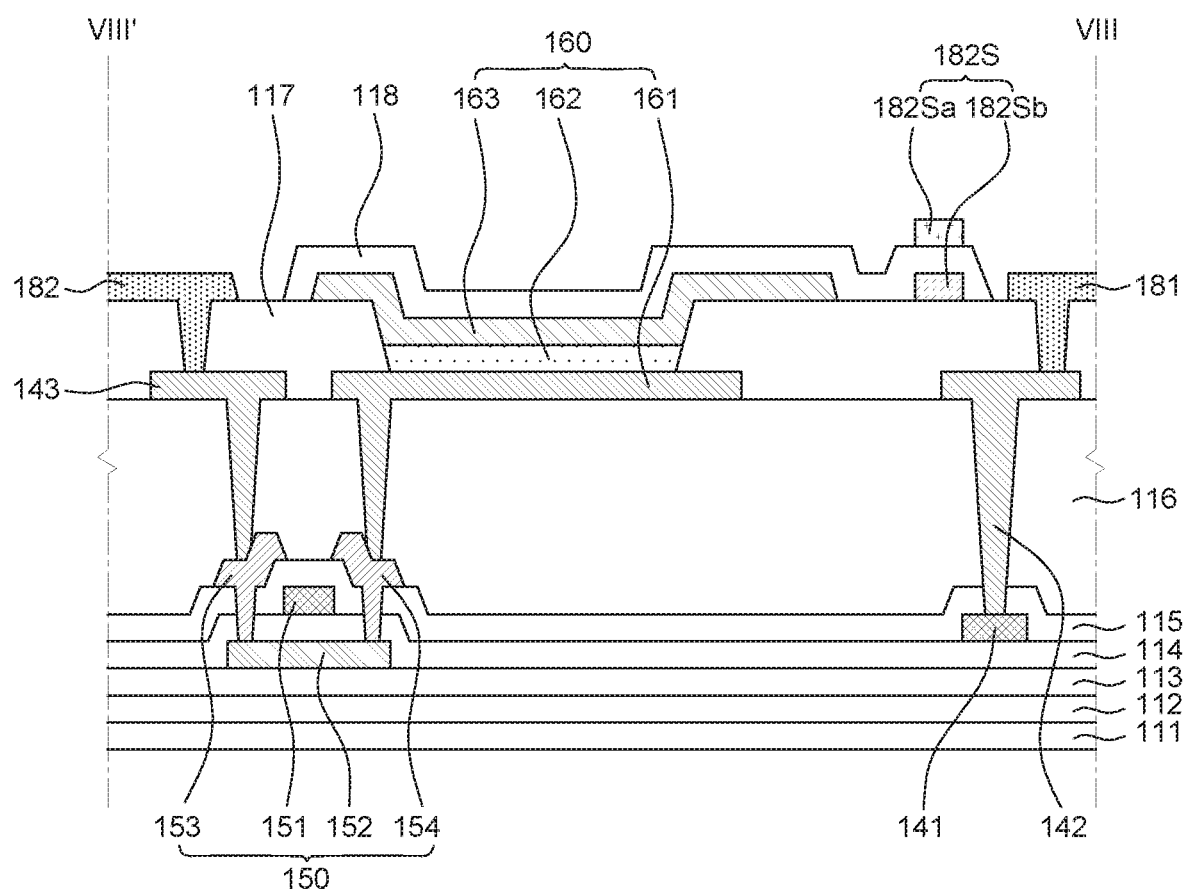
FIG. 9 is a schematic cross-sectional view taken along line VIII-VIII' of FIG. 8.

Before looking into FIGS. 8 and 9, the structure of one subpixel shown in FIGS. 8 and 9, as compared with the subpixel structure shown in FIGS. 2 and 5, is different only in the disposition position of the stretch sensing line and is the same in substantial configuration, so repeated description for the same reference numerals is omitted.

Referring to FIG. 8, a stretch sensing line 182S of a plurality of connecting lines 180 disposed on a first substrate 111 may be disposed to extend in a second direction Y. That is, at least any one of a plurality of second connecting lines 182 extending in the second direction Y may be a second stretch sensing line 182S.

The second stretch sensing line 182S may include a second stretch sensing Rx line 182Sa and a second stretch sensing Tx line 182Sb that may sense the degree of stretch.

Referring to FIG. 8, a gate line 131a for transmitting a gate signal to each subpixel SPX, a high-potential power line 131b for transmitting high-potential power to each subpixel SPX, a low-potential power line 131c for transmitting low-potential power to each subpixel SPX, and first to third data lines 132a, 132b, and 132c for transmitting a data signal to each subpixel SPX are disposed on the second substrate 112. Here, the second stretch sensing Rx line 182Sa and the second stretch sensing Tx line 182Sb constituting the second stretch sensing line 182S may be disposed on a separate layer regardless of the first to third data lines 132a, 132b, and 132c transmitting a data signal to each subpixel SPX.

Referring to FIG. 9, the second stretch sensing Rx line 182Sa of the second stretch sensing line 182S disposed on the first substrate 111 may be spaced and disposed apart from a second electrode 163 of an organic light emitting element 160. Further, the second stretch sensing Tx line 182Sb is disposed on the second stretch sensing Rx line 182Sa and an insulating layer 118 may be disposed between the second stretch sensing Rx line 182Sa and the second stretch sensing Tx line 182Sb. In some embodiments, the insulating layer 118 may be an inorganic layer constituting an encapsulation layer (108 in FIG. 3). That is, the second stretch sensing line 182S extending from the first substrate 111 to the second substrate 112 regardless of the first to third data lines 132a, 132b, and 132c is disposed on the second substrate 112 and may be disposed regardless of lines transmitting a signal even on the second substrate 112.

As such, the second stretch sensing line 182S including the second stretch sensing Rx line 182Sa and the second stretch sensing Tx line 182Sb that may sense the degree of stretch by a capacitance difference before and after stretching is disposed to extend the second direction Y that is the same as the direction in which the first to third data lines 132a, 132b, and 132c extend in the stretchable display device according to an embodiment of the present disclosure. Accordingly, it is possible to sense the degree of stretch in the second direction Y by comparing the capacitance values between the second stretch sensing Rx line 182Sa and the second stretch sensing Tx line 182Sb before and after a stretching when the first substrate 111 is stretched in the second direction Y.

Meanwhile, in an embodiment of the present disclosure, the cases when the first stretch sensing line 181S disposed in the first direction X and the second stretch sensing line 182S disposed in the second direction Y are described as different embodiments. However, the first stretch sensing line 181S disposed in the first direction X and the second stretch sensing line 182S disposed in the second direction Y to sense the degree of stretch in both directions may be disposed together in the same first substrate 111.

A more detailed description of the configuration of such stretch sensing lines according to an embodiment of the present disclosure is as follows.

Figure 10:
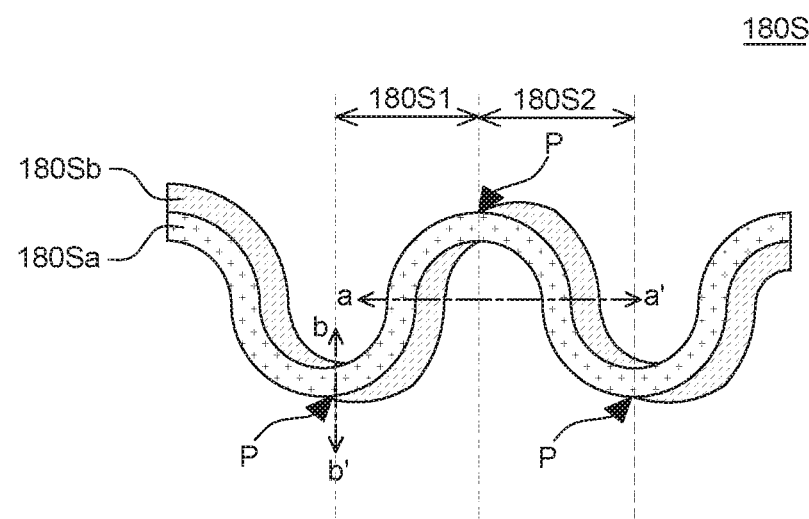
FIG. 10 is a schematic plan view for illustrating the configuration of stretch sensing lines disposed in a stretchable display device according to an embodiment of the present disclosure.
Figure 11:
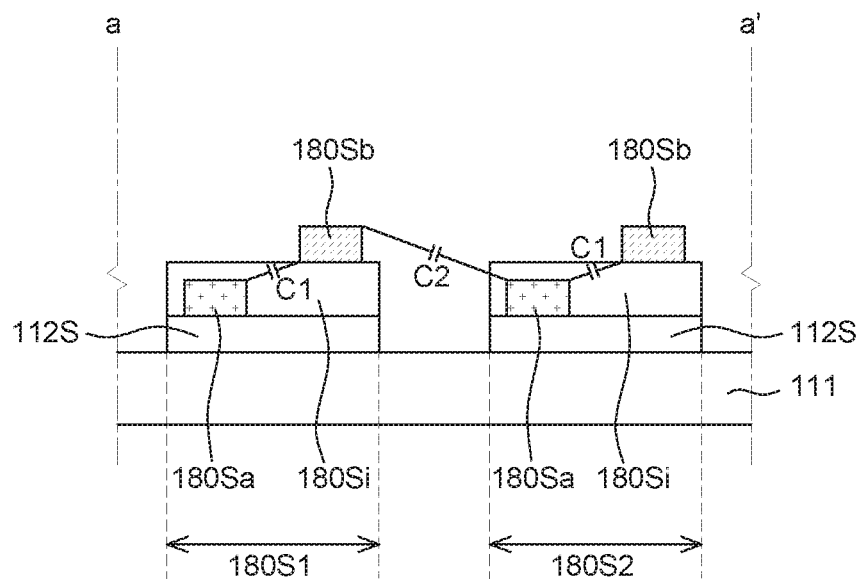
FIG. 11 is a cross-sectional view schematically showing one configuration example taken along line a-a' of FIG. 10.
Figure 12:
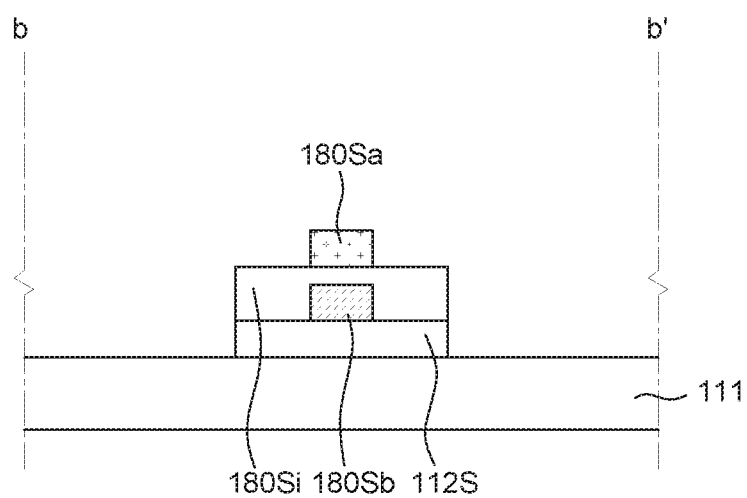
FIG. 12 is a cross-sectional view schematically showing one configuration example taken along line b-b' of FIG. 10.
Figure 13:
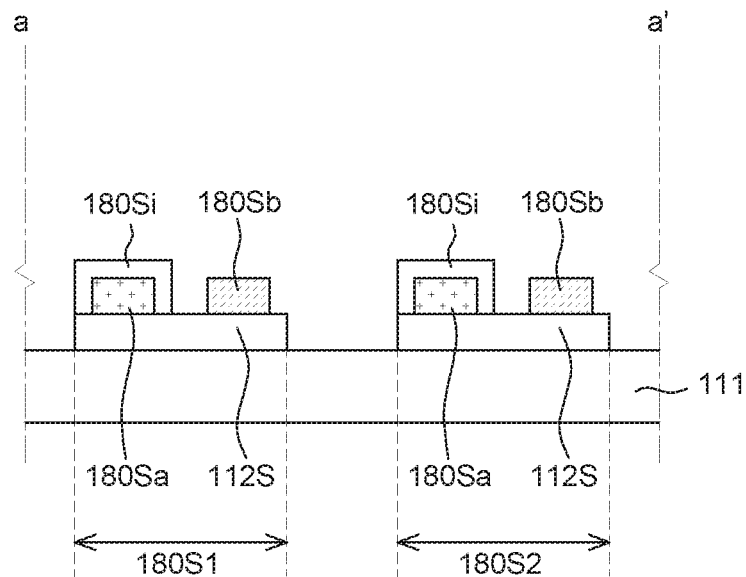
FIG. 13 is a cross-sectional view schematically showing another configuration example taken along line a-a' of FIG. 10.
Figure 14:
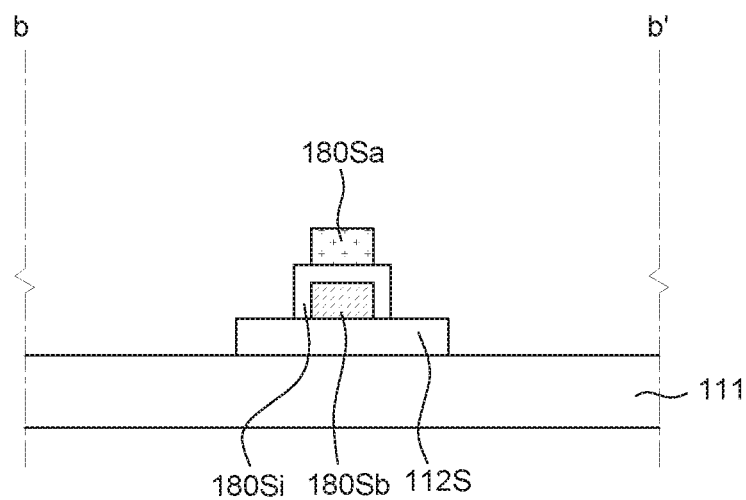
FIG. 14 is a cross-sectional view schematically showing another configuration example taken along line b-b' of FIG. 10.
Figure 15:
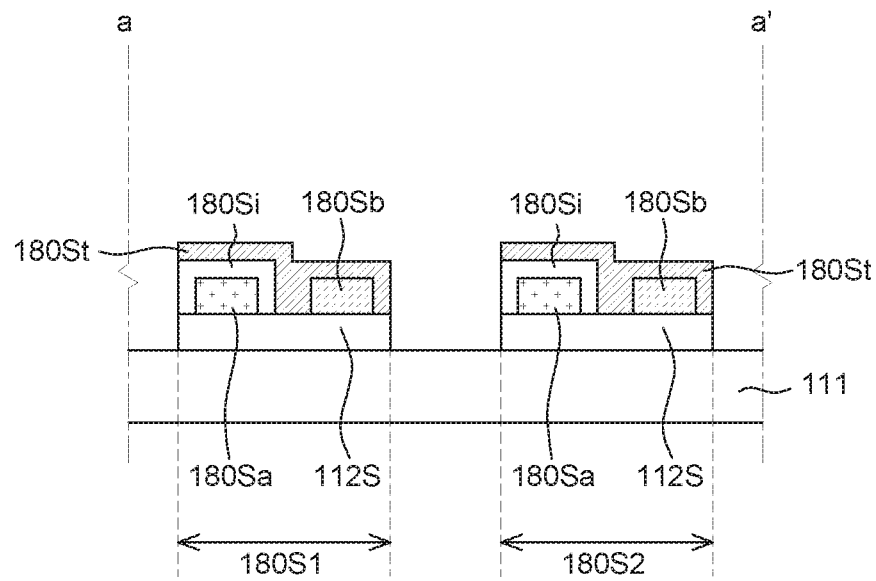
FIG. 15 is a cross-sectional view schematically showing another configuration example taken along line a-a' of FIG. 10.
Figure 16:
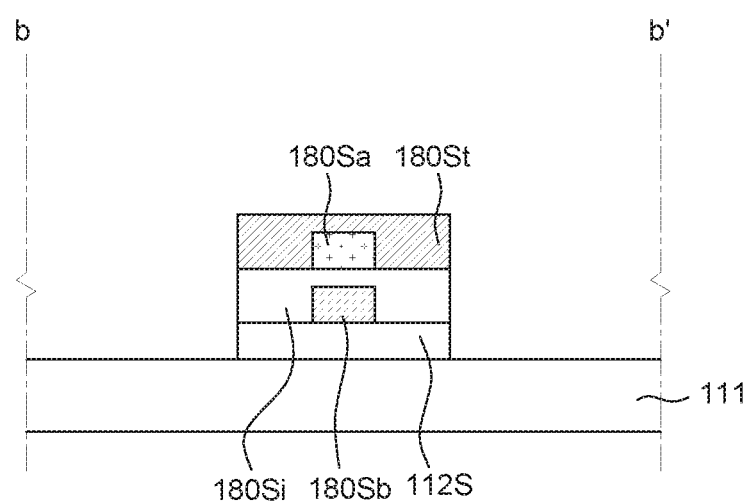
FIG. 16 is a cross-sectional view schematically showing another configuration example taken along line b-b' of FIG. 10.

FIG. 10 is a schematic plan view for illustrating the configuration of stretch sensing lines disposed in a stretchable display device according to an embodiment of the present disclosure. FIG. 11 is a cross-sectional view schematically showing one configuration example taken along line a-a' of FIG. 10. FIG. 12 is a cross-sectional view schematically showing one configuration example taken along line b-b' of FIG. 10. FIG. 13 is a cross-sectional view schematically showing another configuration example taken along line a-a' of FIG. 10. FIG. 14 is a cross-sectional view schematically showing another configuration example taken along line b-b' of FIG. 10. FIG. 15 is a cross-sectional view schematically showing another configuration example taken along line a-a' of FIG. 10. FIG. 16 is a cross-sectional view schematically showing another configuration example taken along line b-b' of FIG. 10.

Referring to FIG. 10, a stretch sensing line 180S disposed on a first substrate 111 may include a stretch sensing Rx line 180Sa and a stretch sensing Tx line 180Sb. Here, the stretch sensing line 180S may include a first stretch sensing line 181S and a second stretch sensing line 182S. Such a stretch sensing line 180S is disposed to have a wavy shape, for example, a sine waveform, so the stretch sensing line 180S may have a plurality of bending points P. Hereafter, for helping understand description, a portion to a bending point that is adjacent in one direction with respect to any one bending point P is referred to and described as a first connecting portion 180S1 and a portion to a bending point that is adjacent in another direction with respect to any one bending point P is referred to and described as a second connecting portion 180S2.

Referring to FIGS. 10 and 11, the stretch sensing Rx line 180Sa and the stretch sensing Tx line 180Sb constituting the stretch sensing line 180S may be disposed in a stacked type. However, in the stretch sensing line 180S, the stretch sensing Rx line 180Sa and the stretch sensing Tx line 180Sb may be disposed to cross at the bending point P. This is configured to sense the degree of stretch of a lower substrate 110 by sensing a capacitance C2 difference between the stretch sensing Rx line 180Sa and the stretch sensing Tx line 180Sb in the present specification. This is for sensing the capacitance C2 difference by disposing a stretch sensing Tx line 180Sb at the first connecting portion 180S1 and a stretch sensing Rx line 180Sa at the second connecting line 180S2 to face each other. However, an embodiment of the present disclosure in which a stretch sensing Rx line 180Sa of the first connecting portion 180S1 and the stretch sensing Rx line 180Sa of the second connecting line 180S2 are disposed to face each other is just described as an example, whereby it may be possible to sense the degree of stretch by sensing a capacitance difference according to the distance of them.

It may also be possible to sense a degree of stretch using the principles of a strain gauge in which the resistance of a wire, such as a copper wire, changes when it is either stretched or compressed. The various lines 180s, 181s 182s etc. can be comprised a copper or another metal that has a known change in resistance based on a selected stretch of the wire. In some embodiments, the flexibility of the display 100 will be of an amount that a stain gauge type stretch sensor will be acceptable, while in other embodiments, the flexibility may be so great that curved, twisty or more flexible connections is preferred to be used for lines 180s, 181s, 182s, etc.

Referring to FIGS. 11 and 12, an insulating layer 180Si is interposed between the stretch sensing Rx line 180Sa and the stretch sensing Tx line 180Sb. Looking into in more detail, the stretch sensing line 180S may include a line damage suppression layer 112S disposed on the first substrate 111, a stretch sensing Rx line 180Sa disposed on the line damage suppression layer 112S, an insulating layer 180Si disposed on the stretch sensing Rx line 180Sa, and a stretch sensing Tx line 180Sb disposed on the insulating layer 180Si.

The line damage suppression layer 112S is disposed along the line shape of the stretch sensing line 180S, thereby being able to suppress damage by stretching of the stretch sensing line 180S. In an embodiment, the line damage suppression layer may be disposed under the stretch sensing line in correspondence to the shape of the stretch sensing line. That is, when the stretch sensing line 180S has a wavy shape, the line damage suppression layer 112S may correspondingly have a wavy shape, and when the stretch sensing line 180S has a straight shape, the line damage suppression layer 112S may correspondingly have a straight shape. For example, the shape of the line damage suppression layer 112S may substantially follow the shape of the stretch sensing line 180S. The line damage suppression layer 112S may be made of a material that is more rigid than the first substrate 111 and may be made of polyimide (PI), polyacrylate, polyacetate, or the like.

A stretch sensing Rx line 180Sa and stretch sensing Tx line 180Sb may be made of a flexible metal material. For example, the stretch sensing Rx line 180Sa and stretch sensing Tx line 180Sb may be made of a metal material such as copper (Cu), silver (Ag), and gold (Au). However, the configuration of the stretch sensing Rx line 180Sa and stretch sensing Tx line 180Sb is not limited thereto. For example, the stretch sensing Rx line 180Sa and stretch sensing Tx line 180Sb may be made by distributing conductive particles in a stretchable base material made of a similar material as the first substrate 111.

The insulating layer 180Si may be made of an insulating material, and for example, may be made as a single inorganic layer made of a silicon nitride (SiNx), a silicon oxide (SiOx), or silicon oxynitride (SiON). However, the material constituting the insulating layer 180Si is not limited only to an inorganic material and may be made of even an organic layer.

Referring to FIG. 11, the stretch sensing Rx line 180Sa and the stretch sensing Tx line 180Sb of the first connecting portion 180S1 are stacked, and spaced and disposed by a predetermined distance, and capacitance between the stretch sensing Rx line 180Sa and stretch sensing Tx line 180Sb In some embodiments may be referred to as first capacitance C1. That is, the first capacitance C1 may be capacitance between the stretch sensing Rx line 180Sa and stretch sensing Tx line 180Sb at the first connecting portion 180S1. Accordingly, the first capacitance C1 value may be a constant value.

Further, the stretch sensing Rx line 180Sa and the stretch sensing Tx line 180Sb of the second connecting portion 180S2 are stacked, and spaced and disposed by a predetermined distance and capacitance between the stretch sensing Rx line 180Sa and stretch sensing Tx line 180Sb In some embodiments may be referred to as first capacitance C1. That is, the first capacitance C1 of the first connecting portion 180S1 and the first capacitance C1 of the second connecting portion 180S2 may have the same value.

Meanwhile, referring to FIG. 11, the capacitance between the stretch sensing Tx line 180Sb of the first connecting portion 180S1 and the stretch sensing Rx line 180Sa of the second connection portion 180S2 may be defined as second capacitance C2. Accordingly, the stretchable display device 1000 according to an embodiment of the present disclosure may sense the degree of stretch of a stretchable display device by sensing a change of the second capacitance C2.

Stretch sensing of the stretch sensing line 180S configured as such may be made through the following expression.

$$\Delta C2 = \text{Capacitance before stretch } (C2) - \text{Capacitance after stretch} \quad \text{[Expression 1]}$$

$$(C2') = \frac{C1C2}{C1+C2} - \frac{C1C2'}{C1+C2'} = C1\left(\frac{C2}{C1+C2} - \frac{C2'}{C1+C2'}\right)$$

In the above expression, C1 is the first capacitance between the stretch sensing Rx line 180Sa and stretch sensing Tx line 180Sb at the first connecting portion 180S1 and the second connecting portion 180S2, C2 is the second capacitance between the stretch sensing Tx line 180Sb at the first connecting portion 180S1 and the stretch sensing Rx line 180Sa at the second connecting portion 180S2 before stretching, and C2' is the second capacitance between the stretch sensing Tx line 180Sb at the first connecting portion 180S1 and the stretch sensing Rx line 180Sa at the second connecting portion 180S2 after stretching.

In stretch sensing of the stretch sensing line 180S configured as such, when the first capacitance C1 value is large in comparison to the second capacitance value C2, sensing by stretch may be easy. For example, when the values of the first capacitance C1 and second capacitance C2 are the same, for example, assuming that the first capacitance C1 and second capacitance C2 values are each 2, a sensing value by stretch is calculated as ⅓ when substituting this value into the [Expression 1] and calculating (first embodiment). Meanwhile, when the first capacitance value of the first capacitance C1 is larger than the second capacitance value of the second capacitance C2, for example, assuming that the first capacitance C1 value is 6 and the second capacitance C2 value is 3, a sensing value by stretch is calculated as ½ when substituting these values into the [Expression 1] and calculating (second embodiment). Further, when the first capacitance value of the first capacitance C1 is smaller than the second capacitance value of the second capacitance C2, for example, assuming that the first capacitance C1 value is 1 and the second capacitance C2 value is 3, a sensing value by stretch is calculated as 1/12 when substituting these values into the [Expression 1] and calculating (third embodiment). As such, when the first capacitance C1 value is higher than the second capacitance C2 value, a sensing value by the largest stretch is derived, so it is possible to find out a sensing change by stretch of the first substrate 111 more easily than when the first capacitance C1 value is higher than the second capacitance C2 value.

As such, in order to more easily sense the degree of stretch of the first substrate 111, the higher the dielectric constant of the insulating layer 180Si than the first substrate 111, the more advantageous it may be. Accordingly, the higher the dielectric constant of the insulating material making the insulating layer 180Si than the insulating material making the first substrate 111, the more advantageous it may be in stretch sensing of the first substrate 111.

Further, in the stretch sensing line 180S, the smaller the distance between the stretch sensing Rx line 180Sa and the stretch sensing Tx line 180Sb disposed on each of the first connecting portion 180S1 and the second connecting portion 180S2 before stretching than the distance between the stretch sensing Tx line 180Sb of the first connecting portion 180S1 and the stretch sensing Rx line 180Sa of the second connecting portion 180S2, the more advantageous it may be in stretch sensing.

Meanwhile, looking into the configuration of the stretch sensing line 180S at a bending point P with reference to FIG. 12, the stretch sensing Rx line 180Sa and the stretch sensing Tx line 180Sb may be disposed in a stacked type on the same vertical axis.

As such, in the stretch sensing line 180S, the configuration in which the stretch sensing Rx line 180Sa and stretch sensing Tx line 180Sb are stacked and the insulating layer 180Si is interposed between the stretch sensing Rx line 180Sa and the stretch sensing Tx line 180Sb may be applied to the embodiment described with reference to FIGS. 2 and 5 described above.

Meanwhile, the stretch sensing Rx line 180Sa and the stretch sensing Tx line 180Sb constituting the stretch sensing line 180S are described above as being sequentially stacked with the insulating layer 180Si therebetween, but the configuration of the stretch sensing line is not limited thereto.

Referring to FIGS. 13 and 14, a stretch sensing line 180S according to another embodiment may be configured such that a stretch sensing Rx line 180Sa and a stretch sensing Tx line 180Sb are disposed in the same plane and an insulating layer 180Si is disposed only on the stretch sensing Rx line 180Sa. By simultaneously forming the stretch sensing Rx line 180Sa and the stretch sensing Tx line 180Sb and then forming the insulating layer 180Si such that the insulating layer 180Si is disposed only on the stretch sensing Rx line 180Sa, it is possible to reduce process steps, as compared with the embodiment shown in FIGS. 10 and 11, so such a stretch sensing line 180S according to another embodiment may be more advantageous in terms of process.

Further, referring to FIGS. 15 and 16, a stretch sensing line 180S may be a structure in which a transparent conductive layer 180St is further disposed in the structure of the stretch sensing line 180S shown in FIGS. 13 and 14. That is, referring to FIGS. 15 and 16, the transparent conductive layer 180St may be disposed to be in direct contact with the insulating layer 180Si and the stretch sensing Tx line 180Sb. In some embodiments, a transparent metal layer 180St may be made of any one of an Indium Tin Oxide (ITO), an Indium Zinc Oxide (IZO), and an Indium Tin Zinc Oxide (ITZO). As such, by disposing the transparent metal layer 180St over the stretch sensing Rx line 180Sa and the stretch sensing Tx line 180Sb and disposed to be in direct contact with any one of the stretch sensing Rx line 180Sa and the stretch sensing Tx line 180Sb, thereby being able optimizing touch sensitivity while increasing a first capacitance C1 value.

In order to sense the degree of stretch of such a first substrate 111, a stretch sensing unit may be further disposed in the stretchable display device 1000 according to an embodiment of the present disclosure.

Figure 17:
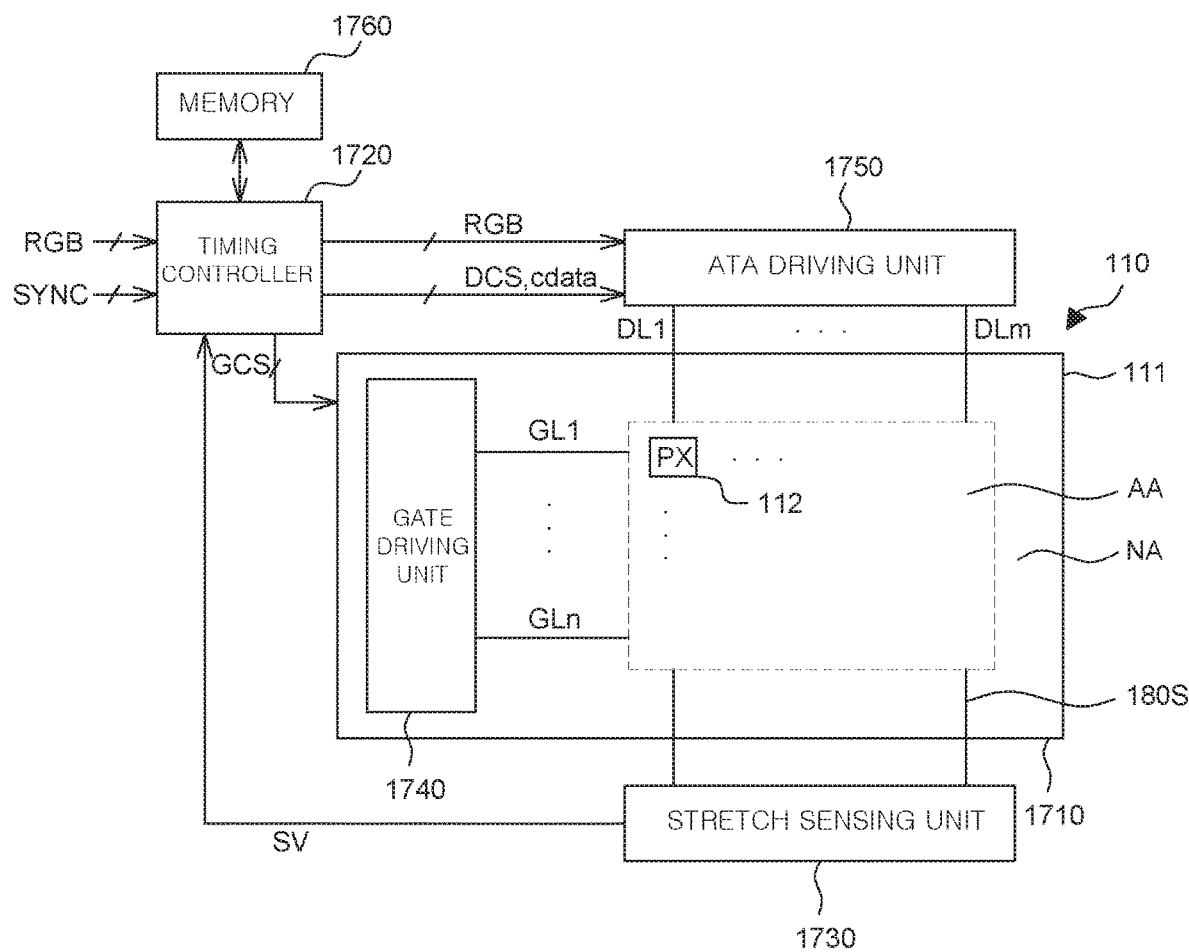
FIG. 17 is a block diagram of a stretchable display device according to an embodiment of the present disclosure.

FIG. 17 is a block diagram of a stretchable display device according to an embodiment of the present disclosure.

Referring to FIG. 17, a stretchable display device according to an embodiment of the present disclosure may include a display panel 1710, a timing controller 1720, a stretch sensing unit 1730, a gate driving unit 1740, a data driving unit 1750, and a memory 1760.

The display panel 1710 includes a plurality of pixels PX electrically connected to n gate lines GL1, . . . , GLn disposed in a first direction, and m data lines DL1, . . . , DLm disposed in a direction that is different from the first direction. Accordingly, the plurality of pixels PX display an image by a driving signal or a driving voltage applied through the gate lines GL1, . . . , GLn and the data lines DL1, . . . , DLm.

The display panel 1710 includes an active area AA and a non-active area NA adjacent to the active area AA. A plurality of pixels PX is disposed in the active area AA and an image is displayed on the basis of gradation that each pixel PX displays. In each of the plurality of pixels PX, a pixel circuit in which a light emitting element from which light is emitted and a plurality of driving elements for driving the light emitting element are disposed is disposed. Because such a display panel 1710 is configured to be able to stretch, it may have a structure in which a second structure 112 made of a material that is more rigid than a first substrate 111 may be disposed in an area where pixels PX are disposed on the first substrate 111 made of a stretchable material.

In one embodiment of FIG. 17, the pliable substrate 111 may be disposed only under the light emitting elements of the active area AA. The NA that is the rest of the display panel 1710 can be disposed on a more rigid substrate. Alternatively, the pliable substrate 111 may be disposed under the entire display panel 1710 so that the circuits in the NA, even those who do not omit light, can be flexed and stretched.

The timing controller 1720 processes image data RGB that are input from the outside to be suitable for the size and resolution of the display panel 1710 and then supplies the image data to the data driving unit 1750. The timing controller 1720 creates a plurality of gate control signals GCS and data control signals DCS using synchronous signals SYNC, for example, a dot clock signal DCLK, a data enable signal DE, a horizontal synchronizing signal Hsync, and a vertical synchronizing signal Vsync. Further, the timing controller 1720 receives a stretch degree sensing value of the display panel 1710 sensed by the stretch sensing unit 1730 and creates an image compensation data cdata according to stretch of the display panel 1710 by comparing the received stretch degree value and a lookup table stored in advance in the memory 1760, and may control the image compensation data to be applied to each pixel P through the data driving unit 1750.

The stretch sensing unit 1730 is electrically connected to a stretch sensing line 180S disposed in the display panel 1710 and may sense the degree of stretch before and after stretch of the display panel 1710. The stretch sensing value SV sensed as such may be transmitted to the timing controller 1720. The stretch sensing unit 1730, as described above, senses a capacitance difference before and after stretch between a stretch sensing Rx line 180Sa and a stretch sensing Tx line 180Sb constituting the stretch sensing line 180S and then may transmit a sensed value to the timing controller 1720.

The gate driving unit 1740 supplies a gate signal to the n gate lines GL1, GLn in accordance with a gate control signal GCS supplied from the timing controller 1720. In some embodiments, the gate signal may include at least one scan signal SCAN and light emitting control signal EM.

A common gate driving unit may be configured in a type in which it is formed independently from a display panel and electrically connected to the display panel in various ways. However, the gate driving unit 1740 of a stretchable display device according to an embodiment of the present disclosure may be built in a Gate In Panel (GIP) manner on a non-active area NA in a thin film pattern shape in substrate manufacturing of the display panel 1710. Although FIG. 17 shows that only one gate driving unit 1740 is provided in a non-active area NA of the display panel 1710, the present disclosure is not limited thereto and two gate driving units 1740 may be disposed at both sides of an active area AA.

Since the gate driving unit 1740 is disposed in built-in type in the display panel 1710, a plurality of second substrates (112 of FIG. 1) may be disposed in a space type over the first substrate (111 of FIG. 1) in the non-active areas NA where the gate driving unit 1740 is disposed. That is, the gate driving unit 1740 may be made in a structure in which a circuit constituting each stage constituting the gate driving unit 1740 is disposed on the second substrate (112 of FIG. 1) and a connecting line connecting each stage is disposed on the first substrate (111 of FIG. 1).

The data driving unit 1750 converts image data RGB and compensation data cdata into a data voltage in accordance with a data control signal DCS supplied from the timing controller 1720 and supplies the converted data voltage to pixels P through the m data lines DL1, . . . , DLm. The voltage provided as the data value for the light emitting pixel elements can therefore be changed, whether to increase it or to decrease it to compensate the stretching of the display. The memory 1760 may store compensation data related to stretch of the display panel 1710 in a form of lookup table LUT. Although the memory 1760 is described as a separate configuration from the timing controller 1720 in an embodiment of the present disclosure, the memory 1760 is not limited thereto and may be made as a configuration that is included in the timing controller 1720. The look up table can be created by performing a large number of stretches while measuring the change needed in the data signal to generate a light emitted at each pixel that has the same luminance value and characteristics both when it stretched and when it is not stretched. The stretch value can be measure locally, for a small group of pixels that are undergoing stretch and the compensation amount cdata, can be supplied to only those pixels, or it can be measured for the flexible display as a whole and applied to all active pixels on the display.

A method of sensing the degree of stretch of a stretchable display device according to an embodiment of the present disclosure configured as such is as follows.

Figure 18:
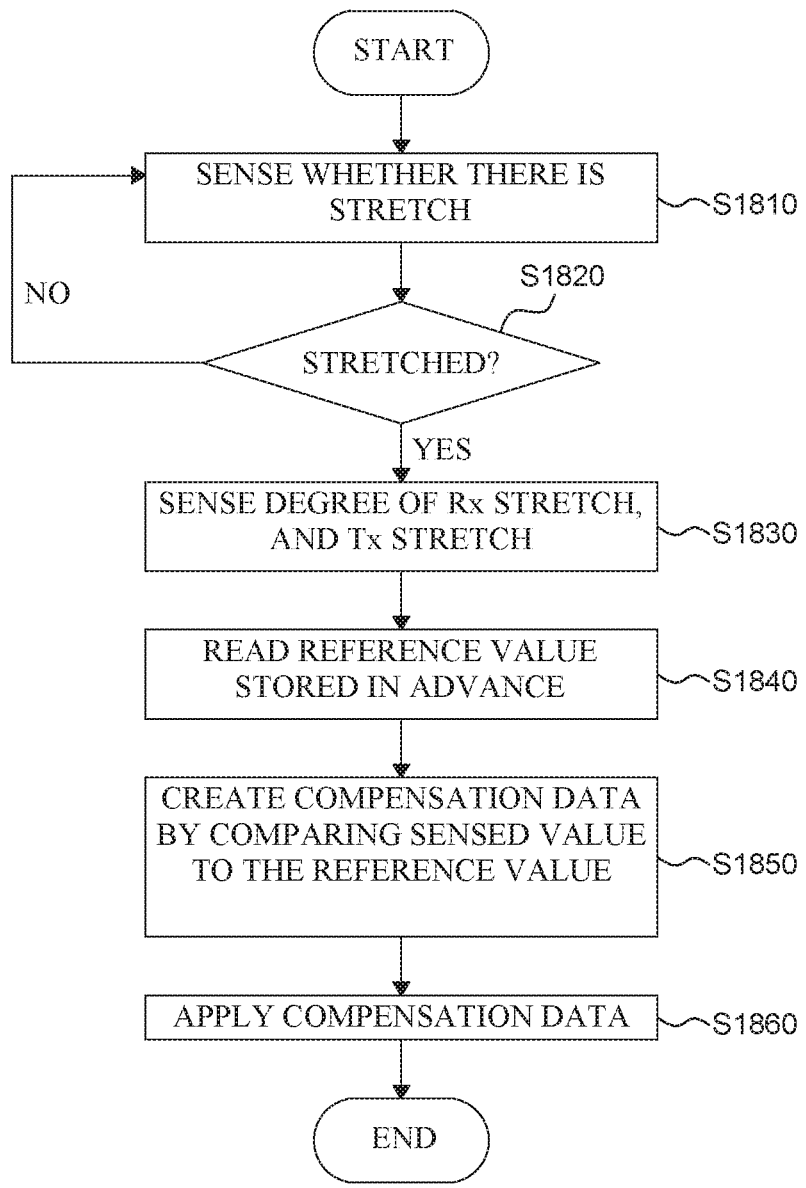
FIG. 18 is a flowchart sequentially showing an image compensation method of a stretchable display device according to an embodiment of the present disclosure.

FIG. 18 is a flowchart sequentially showing an image compensation method of a stretchable display device according to an embodiment of the present disclosure.

The concepts disclosed herein include a method of sensing a stretching of a substrate and measuring the amount of stretch on an active basis, namely, while the stretch is occurring. Steps of this method are also shown in FIG. 18 and are described below.

Referring to FIG. 18, the stretch sensing unit 1730 senses whether stretch of the display panel 1710 has occurred (S1810). The stretch sense of the display panel 1710 may sense the degree of stretch of the display panel 1710 in a period in which a data signal or a gate signal is not applied, in a case that a stretch sensing line senses panel stretch and transmits a data signal or a gate signal.

Further, when a stretch sensing line is separately disposed regardless of signal transmission for stretch sensing, it may be made by control of the timing controller 1720 or may be configured to sense whether there is stretch every set time.

Thereafter, when it is determined that stretch has been made by the stretch sensing unit 1730 (S1820), a sensing value of how much the display panel 1710 has been stretched is calculated (S1830). In some embodiments, a stretch degree sensing value may be calculated through [Expression 1] on the basis of a capacitance difference before and after stretch between the stretch sensing Rx line 180Sa and the stretch sensing Tx line 180Sb.

Such a stretch degree sensing value SV is transmitted to the timing controller 1720 and then the timing controller 1720 reads a predetermined reference value from the memory 1760 (S1840). In some embodiments, the predetermined reference value, as described above, may be stored in a lookup table type in the memory 1760.

Thereafter, the timing controller 1720 creates compensation data cdata by comparing the predetermined reference value and the stretch degree sensing value (S1850) and applies the created compensation data cdata to each pixel P through the data driving unit 1750 (S1860) such that image distortion by stretch of the display panel 1710 is compensated by the compensation data, thereby being able to minimize deterioration of image quality.

According to one embodiment, a method of sensing an amount of stretch in a stretchable display is carried out by the following steps. There is a sensing a first reference value of stretch in a first substrate having a first modulus of elasticity. The first substrate is the flexible substrate 111 as described herein. There are plurality of rigid substrates 112 on the flexible substrate as described herein. After this first reference value is obtained, the first substrate is stretched a first distance. The second substrates are maintained as rigid and unstretched. As a result of the stretching, the second substrates are moved second substrates a second distant from each other that is greater than the first distance. During the stretching the electrical connection by a stretchable conductive line between the plurality of second substrates prior to and after the stretching is maintained. After the stretching the amount of stretch from the first reference value is sensed.

The method also includes generating a stretch compensation signal based on the measured amount of stretch during the stretching. During the stretching, a light emission data signal is transmitted to the organic light emitting diodes. In one embodiment, a timing controller that controls the stretch sensing line will sense a degree of stretch in a period when the data signal is not applied and transmit the data signal to the organic light emitting diode in a period after the degree of stretch has been sensed. A compensation signal to the data signal is generated based on the amount of stretch and the light emission data signal that is transmitted to the organic light emitting diode during the stretching is modified based on the generated compensation signal. In one embodiment, a gate drive signal is transmitted to the at least one transistor on the rigid substrate during the stretching.

After a period of time, the amount of stretch may increase and the steps described above and those shown in FIG. 18 are repeated. Also, after a period of time, the stretching may end and the first substrate is returned to the unstretched shape after the stretching.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display panel comprising:
a first substrate having a first modulus of elasticity;
a plurality of second substrates positioned on the first substrate and spaced apart from each other, each of the second substrates being rigid and having a second modulus of elasticity that is greater than first modulus of elasticity;
at least one semiconductor transistor positioned on each of the second substrates of the plurality of second substrates;
electrically conductive lines extending between respective ones of the second substrates, each of the electrically conductive lines having a wavy shape and configured to be stretched while remaining electrically conductive; and
a stretch sensor positioned on the display panel to sense an amount of stretch of the display panel,
wherein the stretch sensor includes a stretch sensing Rx line and a stretch sensing Tx line for sensing a degree of stretch of the first substrate, and an insulating layer for insulating the stretch sensing Rx line and the stretch sensing Tx line, and
wherein the stretch sensing Rx line and the stretch sensing Tx line are positioned within the electrically conductive lines.

2. The stretchable display panel of claim 1 wherein at least one component of the stretch sensor is positioned on a second substrate of the plurality of second substrates.

3. The stretchable display panel of claim 1 wherein at least one of the electrically conductive lines is a data line that provides a data signal to a light emitting element on each of the second substrates of the plurality of second substrates.

4. The stretchable display panel of claim 1 wherein the second modulus of elasticity is between one thousand times and ten thousand times greater than the first modulus of elasticity.

5. The stretchable display panel of claim 1 wherein the stretch sensor includes a first capacitor whose value remains constant while the stretch sensor is being stretched and a second capacitor whose value varies in relationship to an amount of the stretch while the stretch sensor is being stretched.

6. The stretchable display panel of claim 1 wherein the stretch sensing Rx line is electrically connected to a first data line electrically connected to any one subpixel disposed on each of the plurality of second substrates, and the stretch sensing Tx line is electrically connected to a second data line electrically connected to another subpixel disposed adjacent the any one subpixel disposed on each of the plurality of second substrates.

7. The stretchable display panel of claim 1 wherein the stretch sensing Rx line is electrically connected to a gate line electrically connected to each subpixel disposed on each of the plurality of second substrates, and the stretch sensing Tx line is disposed on the stretch sensing Rx line.

8. The stretchable display panel of claim 1 wherein the stretch sensing Rx line and the stretch sensing Tx line are stacked, and the insulating layer is disposed between the stretch sensing Rx line and the stretch sensing Tx line.

9. The stretchable display panel of claim 1 wherein the stretch sensing Rx line and the stretch sensing Tx line are disposed in the same plane and the insulating layer is disposed on the stretch sensing Rx line.

10. The stretchable display panel of claim 9 further comprising a transparent conductive layer disposed on the insulating layer and the stretch sensing Tx line.

11. The stretchable display panel of claim 1 wherein a dielectric constant of the insulating layer is higher than a dielectric constant of the first substrate.

12. The stretchable display panel of claim 1 wherein at least one of the electrically conductive lines is a gate line for the at least one semiconductor transistor.

13. The stretchable display panel of claim 1 wherein at least one of the electrically conductive lines is a data line for the at least one semiconductor transistor.

* * * * *

UNITED STATES PATENT AND TRADEMARK OFFICE
CERTIFICATE OF CORRECTION

PATENT NO. : 11,037,478 B2
APPLICATION NO. : 16/712256
DATED : June 15, 2021
INVENTOR(S) : JiYoung Ahn et al.

Page 1 of 1

It is certified that error appears in the above-identified patent and that said Letters Patent is hereby corrected as shown below:

On the Title Page

Item (57) Abstract, Line 4:
"substrate having a having a first modulus of elasticity" should read: --substrate having a first modulus of elasticity--.

Item (57) Abstract, Lines 7-8:
"There is a semiconductor circuit have a semiconductor transistor" should read: --There is a semiconductor circuit having a semiconductor transistor--.

Signed and Sealed this
Sixth Day of September, 2022

Katherine Kelly Vidal
*Director of the United States Patent and Trademark Office*